(12) United States Patent
Totzeck et al.

(10) Patent No.: US 7,411,656 B2
(45) Date of Patent: *Aug. 12, 2008

(54) OPTICALLY POLARIZING RETARDATION ARRANGEMENT, AND A MICROLITHOGRAPHY PROJECTION EXPOSURE MACHINE

(75) Inventors: Michael Totzeck, Schwaebisch-Gmuend (DE); Birgit Enkisch, Aalen (DE); Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/337,491

(22) Filed: Jan. 24, 2006

(65) Prior Publication Data

US 2006/0152701 A1 Jul. 13, 2006

Related U.S. Application Data

(63) Continuation of application No. 10/721,378, filed on Nov. 26, 2003, which is a continuation-in-part of application No. 10/151,867, filed on May 22, 2002, now Pat. No. 6,856,379.

(30) Foreign Application Priority Data

May 22, 2001 (DE) ............................ 101 24 803

(51) Int. Cl.
*G03B 27/72* (2006.01)
*G03B 27/28* (2006.01)
*G03B 27/42* (2006.01)
*G03B 27/54* (2006.01)

(52) U.S. Cl. .................. 355/71; 359/499; 359/500; 355/53; 355/67

(58) Field of Classification Search .................. 355/71, 355/53, 67, 68, 55; 359/486, 352, 499, 500; 250/205; 378/70

See application file for complete search history.

(56) References Cited

U.S. PATENT DOCUMENTS 3,146,294 A  8/1964  Koester et al.

(Continued)

FOREIGN PATENT DOCUMENTS

DE  30 35 025 A1  4/1981

(Continued)

OTHER PUBLICATIONS

B. Stenkamp, et al, "Grid Polarizer for the Visible Spectral Region", Proceedings of the Spie, vol. 2213, pp. 228-296, 1994.

(Continued)

*Primary Examiner*—Peter B Kim
(74) *Attorney, Agent, or Firm*—Sughrue Mion, PLLC

(57) ABSTRACT

A retardation arrangement for converting an input radiation beam, incident from an input side of the retardation arrangement, into an output radiation beam which has over its cross section a spatial distribution of polarization states which can be influenced by the retardation arrangement and differs from the spatial distribution of polarization states of the input radiation, is designed as a reflective retardation arrangement. A useful cross section of the retardation arrangement has a multiplicity of retardation zones of different retardation effect. Such a mirror arrangement having a retardation effect varying as a function of location can be used to compensate undesired fluctuations in the polarization state over the cross section of an input radiation beam and/or to set specific output polarization states, for example in order to set radial or tangential polarization.

36 Claims, 9 Drawing Sheets

U.S. PATENT DOCUMENTS

| | | | |
|---|---|---|---|
| 4,755,027 A | 7/1988 | Schaefer | |
| 5,001,716 A | 3/1991 | Johnson et al. | |
| 5,153,772 A | 10/1992 | Kathman et al. | |
| 5,257,132 A | 10/1993 | Ceglio et al. | |
| 5,365,371 A | 11/1994 | Kamon | |
| 5,436,761 A | 7/1995 | Kamon | |
| 5,638,200 A | 6/1997 | Xu | |
| 5,691,802 A | 11/1997 | Takahashi | |
| 5,847,872 A | 12/1998 | Ito | |
| 5,848,119 A | 12/1998 | Miyake et al. | |
| 6,072,629 A | 6/2000 | Fan et al. | |
| 6,252,712 B1 | 6/2001 | Fuerter et al. | |
| 6,392,792 B1 | 5/2002 | Naulleau | |
| 6,999,172 B2 | 2/2006 | Masaki et al. | |
| 7,053,988 B2 * | 5/2006 | Totzeck et al. | 355/71 |
| 2001/0052968 A1 | 12/2001 | Shiozawa | |
| 2002/0171922 A1 | 11/2002 | Shiraishi et al. | |
| 2002/0176166 A1 | 11/2002 | Schuster | |
| 2003/0011755 A1 * | 1/2003 | Omura et al. | 355/67 |
| 2003/0038225 A1 * | 2/2003 | Mulder et al. | 250/205 |
| 2003/0081722 A1 * | 5/2003 | Kandaka et al. | 378/70 |
| 2003/0099034 A1 | 5/2003 | Mann et al. | |

FOREIGN PATENT DOCUMENTS

| | | |
|---|---|---|
| DE | 195 35 392 A1 | 3/1997 |
| DE | 198 07 120 A1 | 8/1999 |
| DE | 101 24 803 A1 | 5/2001 |
| DE | 101 24 474 A1 | 11/2002 |
| DE | 103 24 468.9 | 1/2005 |
| EP | 0279670 A2 | 8/1988 |
| EP | 0 764 858 A2 | 3/1997 |
| GB | 2 088 078 A | 6/1982 |
| JP | 05181088 A | 7/1993 |
| WO | WO 98/52077 A1 | 1/1998 |
| WO | WO 2004057400 A1 | 7/2004 |

OTHER PUBLICATIONS

M. Born et al, "Principles of Optics", Pergamon Press, p. 694, 1980.

Fukuda et al.: "New optics design methodology using diffraction grating on spherical mirrors for soft x-ray projection lithography", 8257b Journal of Vacuum Science & Technology B 13(1995)Mar./Apr., No. 2, New York, NY, US, pp. 366-370.

Khan Malek et al.: "Fabrication of high-resolution multilayer reflection zone place microlenses for the soft x-ray range", 2417 Optical Engineering 30(1991) Aug., No. 8, Bellingham, WA, US, pp. 1081-1085.

* cited by examiner

OPTICALLY POLARIZING RETARDATION ARRANGEMENT, AND A MICROLITHOGRAPHY PROJECTION EXPOSURE MACHINE

This is a continuation of U.S. application Ser. No. 10/721,378, filed Nov. 26, 2003, which is a continuation-in-part application of U.S. application Ser. No. 10/151,867, filed on May 22, 2002, now U.S. Pat. No. 6,856,379 B2, issued Feb. 15, 2005. Each of these applications, including the present application, claims priority from and benefit of German Patent Application 101 24 803.2, filed May 22, 2001.

FIELD OF AND BACKGROUND OF THE INVENTION

The invention relates to a retardation arrangement for converting an input radiation beam, incident from an input side of the retardation arrangement, into an output radiation beam which has over its cross section a spatial distribution of polarization states which can be influenced by the retardation arrangement and differs from the spatial distribution of polarization states of the input radiation beam, and to a microlithography projection exposure machine having at least one such retardation arrangement.

OBJECTS OF THE INVENTION

In order to increase the imaging power of projection exposure machines for microlithography, it is frequently advantageous to set polarization states in a targeted fashion within the illumination system and/or in the case of the projection objective. For example, it is possible for a polarization state provided by the radiation of the primary light source to vary in an undesired way controllable with difficulty during passage through the projection exposure machine. Contributors to this can be, for example, intrinsic birefringence (IDB) or strain birefringence (SDB), caused by mechanical strains, in calcium fluoride ($CaF_2$) and other materials which can be used for transparent optical components in the deep ultraviolet (DUV) region. Likewise, antireflection coatings and reflective coatings (mirror coatings) can unfavourably alter the polarization state of the radiation such that, for example, a linear polarization state at the input of the illumination system is converted into an undefined elliptic polarization state at the exit of the projection objective. Since the optically polarizing effect of the components is generally not the same overall, the output polarization state is also generally not constant over the cross section of the radiation beam. Generic retardation arrangements can contribute to a compensation of such effects. The polarization state of the radiation used for image generation is frequently also influenced in a targeted fashion in order to improve the imaging quality. Use may be made for this purpose of generic retardation arrangements in the illumination system and/or in the projection objective.

DE 195 35 392 (corresponding to EP 0 764 858 B1) discloses a generic retardation arrangement which is provided for use in the illumination system of a projection exposure machine operating in the deep ultraviolet region, and which generates an output radiation beam which contains radiation polarized substantially in a radial direction over its entire cross section. The radial polarization is well suited for objectives with a typical image-side numerical aperture (NA) of approximately $0.5 \leq NA \leq 0.7$ and photoresist without antireflection coating for the purpose of optimizing efficiency of coupling into the resist material. Tangential polarization, in which the local preferred polarization direction is substantially perpendicular to the radial direction of the beam, is frequently preferred for optimizing the two-beam interference in the case of very high numerical apertures, and can likewise be set by means of suitable retardation arrangements. An embodiment, effective in transmission, for converting linearly polarized input radiation into radially polarized output radiation has a multiplicity of hexagonal half-wave plates made from birefringent material which are arranged in a surface-filling fashion and whose main crystallographic axes are aligned perpendicular to the direction of incidence of the input radiation such that each half-wave plate deflects the direction of polarization of the locally incident radiation in the direction of a radius which intersects the half-wave plate and is directed onto the optical axis of the retardation arrangement.

DE 101 24 803 (corresponding to US 2002/0176166 A1) discloses a retardation arrangement which is provided for comparable purposes, is effective in transmission, and consists in one embodiment of a transparent plate made from birefringent material on the entrance side and exit side of which there are in each case small regions with deflecting structures in the form of gratings or of refractive structures. The main crystallographic axis of the birefringent plate material is aligned parallel to the optical axis of the retardation arrangement, and thus substantially parallel to the irradiation direction of the input radiation beam. The deflecting structures produce an oblique passage of radiation through the plate material. Output radiation beams with a cylindrically symmetrical polarization distribution (tangential or radial) can be generated, for example, from incoming circularly or linearly polarized light by means of locally varying setting of suitable angles of inclination between the transit direction and the main crystallographic axis as well as suitable directions of inclination and plate thicknesses.

The as yet unpublished German Patent Application DE 103 24 468.9 from the applicant describes microlithography projection exposure machines in which transparent retardation elements which have form-birefringent grating structures whose arrangement varies locally over their useful cross section can be used for the purpose of setting a desired polarization state of the radiation.

SUMMARY OF THE INVENTION

It is an object of the invention to provide a retardation arrangement of the type mentioned at the beginning whose use permits a particularly favourable design of the optical systems equipped therewith. It is another object to provide retardation arrangements which can be used in lithography systems for extreme ultraviolet (EUV) light.

In order to achieve these and other objects, in accordance with one formulation, the invention provides a retardation arrangement for converting an input radiation beam, incident from an input side of the retardation arrangement, into an output radiation beam which has over its cross section a spatial distribution of polarization states which can be influenced by the retardation arrangement and differs from the spatial distribution of polarization states of the input radiation beam, wherein the retardation arrangement is designed as a reflective retardation arrangement, and a useful cross section of the retardation arrangement has a multiplicity of retardation zones with a different retardation effect.

Such a mirror arrangement with a retardation effect varying as a function of location can be used, for example, for compensating undesired fluctuations in the polarization state over the cross section of an input radiation beam, in order to generate an output radiation beam having a polarization which is largely uniform over its cross section. It can also be used for the purpose of setting locally different polarization states in the individual retardation regions in order, for example, to generate an output radiation bundle having radial polarization or tangential polarization. Also possible is a combination of polarization compensation and targeted setting of a distribution of the state of polarization of the output radiation which varies as a function of location. Owing to the configuration as reflective retardation arrangement, it is possible to construct optical systems with folded beam paths, in the case of which the intervention in the polarization state of the radiation is performed in the region of the fold. Also possible are embodiments for substantially perpendicular incidence of radiation in the case of which the direction of the input beam runs substantially anti-parallel to the direction of the output beam, examples being retardation arrangements for a non-perpendicular incidence in the case of which the input beam and the output beam run obliquely at an angle to one another in relation to an optical axis of the retardation arrangement.

Reflective retardation arrangements can, for example, contribute in the fashion of deflecting mirrors to the solution of problems with installation space, and permit alternative production methods. Concave mirror arrangements with a retardation effect, varying in a spatially resolving fashion, for catadioptric projection objectives or other imaging systems are likewise possible.

In accordance with one development, the retardation arrangement comprises at least one transparent birefringent transmission element and a mirror with a reflecting surface which is arranged at a side of the transmission element situated opposite the entrance side of the retardation arrangement in such a way that after a first passage through the transmission element the input radiation is retroreflected for a second passage through the transmission element. The birefringent transmission element can thereby be used in two-fold passage such that, by comparison with a single passage, it is possible to achieve longer retardations, that is to say larger path differences between the field components, polarized perpendicular to one another, of the radiation. The reflecting surface can be arranged directly at an exit side of the transmission element which is situated opposite the entrance side of the retardation arrangement such that the retardation arrangement can be constructed in the fashion of a rear surface mirror. There are also embodiments in the case of which a spacing exists between an exit surface of the transmission element and the reflecting surface. An interspace between transmission element and reflecting surface can be free from material or filled at least partially with a transparent material in order, for example, to reduce the angle of incidence and/or to compensate phase errors. The reflecting surface and/or the transmission element can be flat or curved, for example concavely curved.

In order to ensure that the polarization-varying properties of the retardation arrangement are determined largely or exclusively by the properties of the birefringent transmission element, the reflection properties of the reflecting surface should be designed such that the reflectivity and, if appropriate, a phase-retarding effect are substantially equal for radiation polarized perpendicular and parallel to a plane of incidence. If the mirror itself exerts a retardation effect on the reflective radiation, it should be ensured when designing the birefringent transmission element that its retardation properties are adapted to the retardation effect of the mirror in order to achieve overall the desired retardation effect varying as a function of the location. There are various possibilities for implementing a birefringent transmission element within the scope of the invention. In particular, it is possible to use volume polarization effects, such as the birefringence of one-axis and two-axis crystals, which use the intrinsic birefringence (IDB) and/or the strain birefringence (SDB), induced by mechanical strains, for generating phase retardations.

In one embodiment, the birefringent transmission element comprises a multiplicity of retardation elements arranged next to one another and made from transparent birefringent material, each of the retardation elements having an axial thickness (measured parallel to the optical axis of the retardation arrangement) and a main crystallographic axis situated at a specific angle of inclination to a transirradiation direction, the axial thickness and the angle of inclination being designed to generate a prescribable path difference between the field components, aligned perpendicular to one another, of the radiation in the case of two-fold passage through the retardation element.

One variant is distinguished in that the main crystallographic axes of the retardation elements are aligned in different directions that are perpendicular to the optical axis of the retardation arrangement. For embodiments which are designed for substantially perpendicular incidence of radiation (incidence of radiation substantially parallel to the optical axis of the retardation arrangement), the birefringent transmission element can be constructed substantially as shown in DE 195 35 392. The disclosure content of DE 195 35 392 is incorporated into the content of this description by reference. However, since a two-fold passage of the radiation through the transparent birefringent material occurs in the case of reflective retardation arrangements of the type described here, the axial thickness of the retardation elements can be reduced, for example halved, by comparison with the embodiments shown there. Higher order retardation arrangements (for example with phase retardations of more than one working wavelength) are likewise possible and can be correspondingly thicker. In another embodiment, at least one birefringent transmission element is provided which has a main crystallographic axis and an axial thickness, the useful cross section, that is to say the illuminated cross section, of the retardation arrangement being divided into a multiplicity of retardation zones. At least one of the retardation zones is designed such that the transit direction of the radiation through the birefringent transmission element in the retardation zone runs obliquely to the direction of the main crystallographic axis of the retardation zone in such a way that the transit direction encloses with the main crystallographic axis an angle of inclination of more than 0° and less than 90°. The transit direction and the direction of the main crystallographic axis define a transit plane. The axial thickness and the angle of inclination are adapted to one another for the at least one retardation zone in such a way that an optical path length difference of the field components in the retardation zone after two-fold passage through the retardation element corresponds to a prescribed path difference, and the orientation of the transit plane is set for each retardation zone so as to produce the preferred polarization direction desired locally for the retardation zone. Each of the retardation zones is preferably designed in this way.

In each of its obliquely transirradiated retardation zones, the retardation arrangement acts like a retardation plate in which, in a single passage, the path difference G is yielded in accordance with $G = W \times |n_{ao} - n_o|$ from the product of the path length W, traversed in the transit direction, between entrance and exit and the magnitude of the difference between the refractive indices $n_o$ and $n_{ao}$ for the two field components (ordinary ray and extraordinary ray) polarized perpendicular to one another. This difference is therefore a function of the orientation of the refractive index ellipsoid. Here, the difference in refractive index of the field components, which codetermines the path difference, is a function of the angle of inclination NW and of the type of birefringent material, and can be set by selecting the angle of incidence. When the ray is retroreflected, substantially double the path difference is yielded in the double passage.

If, for example, a small angle of inclination is set to the main crystallographic axis, the difference in refractive index, which vanishes in the direction of the main crystallographic axis, is relatively small, and thus the axial thickness can be selected to be appropriately large in order to achieve a desired path difference. This facilitates the production and the handling of retardation arrangements according to the invention, which can optionally be designed as self-supporting components. It is possible by selecting the axial thickness to adapt the mode of operation of the retardation arrangement to the polarization state of the incident radiation, and to adapt the desired polarization distribution to the output radiation. If, for example, a path difference (in the two-fold passage) of a quarter of the optical wavelength (or an odd multiple thereof) is set, circularly polarized radiation entering through each of the retardation zones can be converted into exiting linearly polarized radiation. The direction of inclination can be used to set for each retardation zone the alignment of the preferred polarization direction in the exit plane lying on the entrance side of the retardation arrangement, for example in a tangential or radial direction to the optical axis of the retardation arrangement. In the case of setting of a half-wave path difference (or an odd multiple thereof) after two-fold passage, a local rotation of incident linearly polarized radiation into exiting linearly polarized radiation is possible. This can be aligned radially or tangentially to the optical axis by suitable local setting of the direction of inclination in the retardation zones, for example in each retardation zone. A linear polarization aligned in a substantially uniform fashion over the entire useful cross section is likewise possible. It is to be noted in this case that there is generally a functional relationship between angle and the retardation effect.

One advantageous development is distinguished in that a birefringent transmission element is provided with a main crystallographic axis which is substantially parallel to the optical axis of the retardation arrangement, and that the birefringent transmission element is assigned for each retardation zone at least one deflecting structure which deflects the incident radiation such that the latter penetrates the retardation zone with the angle of inclination and the direction of inclination provided for the retardation zone. A retardation arrangement of simple design and which is particularly easy to produce is therefore possible with the aid of a single birefringent transmission element filling the cross section of the retardation arrangement.

In order to permit a radiation exit parallel to the radiation entrance, it is preferable for deflecting structures for deflecting the incident radiation into the oblique transit direction to be provided on an input side of the birefringent transmission element, and for assigned deflecting structures for cancelling the deflection to be provided on the exit side. For example, the birefringent transmission element can be formed by a plane-parallel plate made from magnesium fluoride or quartz crystal, on the entrance side and/or exit side of which the deflecting structures are produced in a form corresponding to structured surface regions. This renders possible a retardation arrangement which is constructed with the aid of a single optically active transmission element and substantially has the form of a thin plate and can therefore be installed even in a restricted installation space at a suitable position inside a projection exposure machine, for example in the range of small beam angles close to or in a pupil plane.

The deflecting structures of each retardation zone serve the purpose of deflecting the radiation incident in the retardation zone into the transit direction provided for this retardation zone, or of cancelling this deflection. Here, this structure can be a diffracting structure, for example of the type of a linear grating, a refracting structure, for example of the type of a Fresnel surface, or a structure in the case of which both optical diffraction and refraction contribute to the deflection, for example of the type of a blazed grating. Holographic structures are also possible.

The assigned reflecting layer can be arranged at a distance behind the exit side of the transmission element, for example at a separate mirror. It can also be positioned directly at the exit side of the transmission element, for example in the form of a thin reflective coating.

It is expedient to divide the illuminated useful cross section into small fields or zones of constant deflection, for example into small hexagonal zones which fill up the illuminated cross section of the retardation arrangement more or less without gaps. Other, preferably polygonal shapes of zone, for example squares or triangles are also possible. Retardation zones can also be fashioned in the shape of an annulus or of an annular segment or of a circular segment. The number of the zones or fields is preferably of the order of magnitude of 10 or 100 or above such that the zones preferably have typical mean cross sectional areas of less than 10%, in particular between 10% and 1% of the total area of the useful cross section. The size of the zones can be adapted here to the directional tolerance, permissible for the application, of the locally desired preferred polarization direction. In the case of preferred embodiments, this is in the range of ±2% or below. The desired local radial or tangential polarization can be distributed virtually continuously with the aid of smaller range sizes. A continuous transition of the structures without defined range limits is also possible. It is likewise possible for there to remain between the active retardation zones small gaps which can be tolerated, in particular, when the retardation arrangement is used in the illumination system.

In the case of embodiments of the retardation arrangements according to the invention which are provided for an oblique incidence of radiation, it should be borne in mind that the axial thickness of the birefringent transmission element, and the lateral extent of the retardation zones are adapted to the angle of incidence of the input radiation in such a way that a predominant fraction of the radiation entering a retardation zone also exits again from the same retardation zone and does not transradiate neighbouring retardation zones. It is thereby possible to reduce or avoid disturbances in the boundary regions to neighbouring retardation zones in the case of oblique incidence. It is preferable for this purpose when a lateral extent of the retardation elements is large by comparison with the axial thickness of the birefringent transmission element. The ratio between lateral extent and axial thickness of the retardation elements can be, for example, more than 50 or more than 100 or more than 1000 or more than 10000.

Another class of retardation arrangements according to the invention is distinguished in that a plurality of birefringent transmission elements are arranged, preferably in a surface-filling fashion, in the cross section of the retardation arrangement, wherein, for each of the birefringent transmission elements, the main crystallographic axis is tilted obliquely to the optical axis of the retardation arrangement such that the desired angle of inclination and the direction of inclination results for the zone. Thus, these are segmented retardation arrangements which are of multipartite design, which design can resemble those of the embodiments shown in FIG. 1 of DE 195 35 392, but with the difference that, for the retardation arrangements considered here, the main crystallographic axes of the retardation zones are aligned obliquely to the optical axis of the retardation arrangement and to the plane of the plate.

In the case of another embodiment, the retardation arrangement has a substrate (carrier) and a reflective coating arranged on the substrate, wherein the reflective coating has a locally varying, polarization-varying reflective effect for the purpose of forming retardation zones with a different retardation effect. Such a reflective coating having polarization-varying properties which vary as a function of location can be applied, for example, directly to a front side, facing the entrance side of the retardation arrangement, of the substrate (front surface mirror).

In one embodiment, the reflective coating is configured as anisotropic reflective coating with a spatial variation in the anisotropy of the reflective coating. The variation in the anisotropy can influence the direction and/or the absolute magnitude of a phase split, generated by the coating, of the incident radiation.

The anisotropic reflective coating can be configured in the manner of a dielectrically reinforced metal mirror. Applied to the carrier in one embodiment is a metal layer to which there is applied an anisotropic dielectric layer made from at least one transparent dielectric material having one or more individual layers. Anisotropic dielectric multilayer reflective coatings without a metal layer are also possible. The spatial distribution of the retardation effect can be designed so as to produce an effective distribution of birefringence (retardation distribution) which is substantially rotationally symmetrical in relation to the optical axis of the retardation arrangement. It is also possible to set an effective birefringence distribution which has a birefringence increasing or decreasing in a radial direction. In some cases, for example for the purpose of compensating polarization effects which are produced by intrinsic birefringence of fluoride crystals, it can be advantageous if the birefringent distribution is not rotationally symmetrical. For example, it is possible to provide an azimuthal modulation of the intensity of the birefringence which preferably exhibits a multiple symmetry with reference to the optical axis of the retardation arrangement, in particular a 2-fold, 3-fold, 4-fold or 6-fold symmetry. In this case, the retardation zones can be configured in the manner of circular segments of corresponding angular extent. The retardation zones can also be arranged next to one another in the manner of neighbouring cells of polygonal shape (for example hexagonal, triangular, rectangular) with interposed gaps or in a surface-filling fashion.

In order to produce anisotropic dielectric layers, the coating material can be applied to at least one region of the substrate surface at a large angle of coverage, for example by vacuum deposition at large vacuum deposition angles of 40° or more. Masking techniques employing vignetting stops can be used when coating in order to produce retardation zones which are suitably dimensioned and shaped.

A preferred field of application of the invention is projection exposure machines for microlithography where use is made of electromagnetic radiation from the ultraviolet region, in particular with wavelengths of less than 260 nm (for example 248 nm, 193 nm or 157 nm). The previously-described embodiments are particularly suitable for this wavelength, since transparent materials are available both for producing birefringent transmission elements and for producing dielectric interference layers. However, the invention is not limited to these wavelengths, but can also be used with radiation from the extreme ultraviolet region (EUV), use being made, for example, of radiation with a wavelength of approximately 13 nm in purely reflected projection systems for microlithography.

In one embodiment, the retardation arrangement has a substrate and a reflective coating which is applied to the substrate, which is effective for radiation from the extreme ultraviolet (EUV) region, and which has a locally different polarization-varying reflective effect for the purpose of forming retardation zones with a different retardation effect. The reflective coating can be designed as a multilayer reflective coating having layers, lying one above another, of suitable material (for example molybdenum and silicon).

The multilayer reflective coating can be constructed in the vicinity of the mirror substrate like a conventional EUV multilayer mirror. In order to generate a polarization-dependent phase transmission, it is possible to provide on this layer arrangement a grating arrangement of narrow structures running next to one another at a spacing which are likewise constructed in an inherently multilayer fashion and, for example, continue the layer sequence of the mirror situated therebelow. At least in some regions, the grating structure can be periodic with a period length of the order of magnitude of the radiation wavelength, but preferably being shorter than the radiation wavelength (sub-λ structures). It is possible thereby to generate a birefringence effect similar to the structure-induced birefringence known from transparent optical components (shape birefringence). The arrangement of the diffractive structural elements, that is to say, in particular, their alignment, their periodicity spacing and/or the structural depth can vary locally in order to form retardation zones of different retardation effect.

The shape birefringence used in this case is a property which originates substantially from an inhomogeneous material distribution in the diffractive structures, and emerges particularly strongly whenever the spacing of the structural element is smaller than the wavelength of the incident radiation. Given sufficiently small grating structures, even the zero-th diffraction order, for example, is sufficient for propagation (zero-order grating). The spacing of structural elements is therefore preferably less than 90% or 80% or 70% of the operating wavelength.

Reflective retardation arrangements in accordance with the invention can be beneficially used in many optical systems. Application is preferred in an illuminating system and/or in a projection objective of a microlithography projection exposure machine.

The present and further features proceed from the claims and from the description and the drawings, it being possible for the individual features to be implemented on their own or severally in the form of subcombinations in an embodiment of the invention and in other fields and, advantageously, also to constitute embodiments inherently capable of protection.

DETAILED DESCRIPTION OF THE PREFERRED EMBODIMENTS

Figure 1:
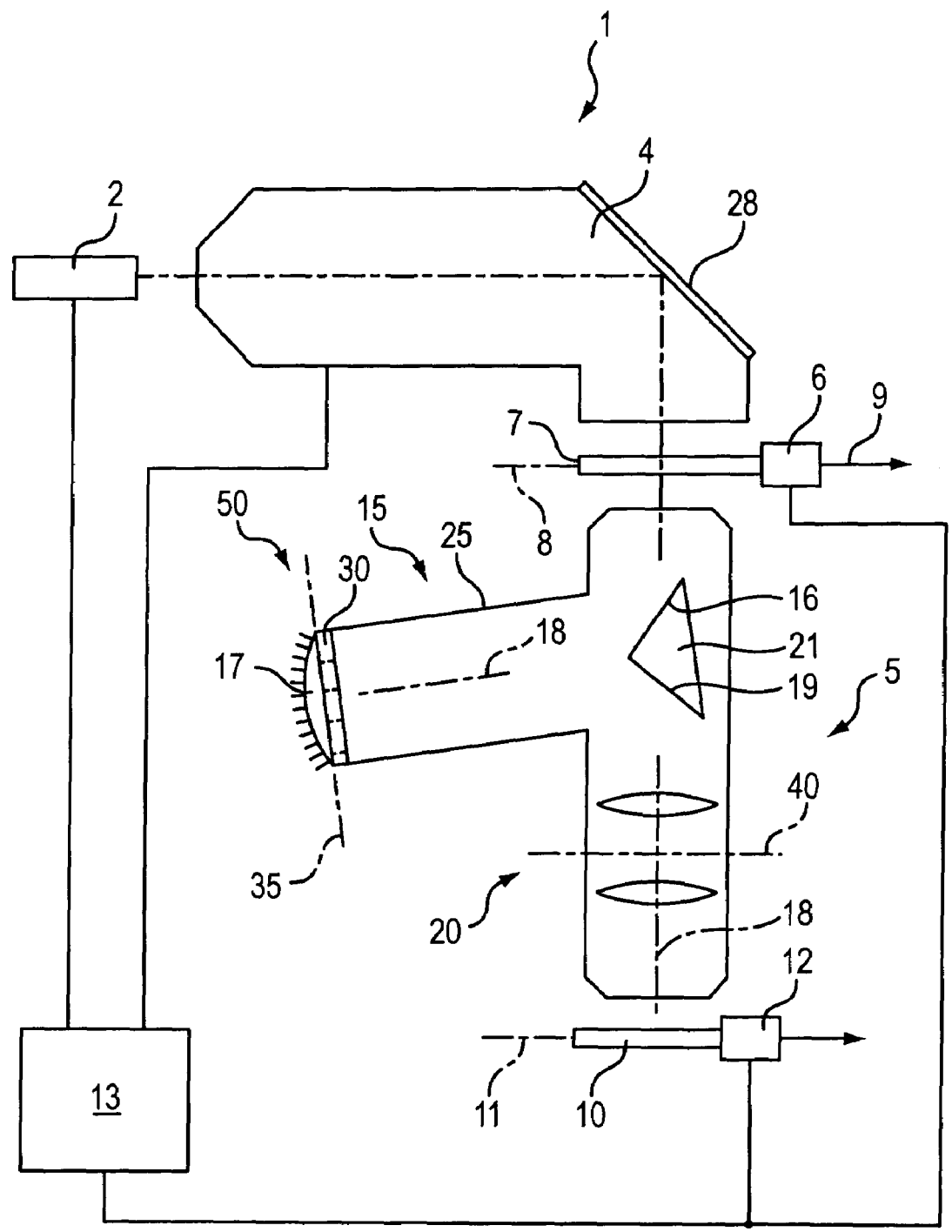
FIG. 1 shows a diagrammatic illustration of a microlithography projection exposure machine, designed as a wafer stepper, which comprises a catadioptric projection objective with geometrical beam splitting in accordance with an embodiment of the invention.

A microlithography projection exposure machine in the form of a wafer stepper 1 which is provided for producing semiconductor components of large-scale integration is shown diagrammatically in FIG. 1. The projection exposure machine comprises as light source an excimer laser 2 which emits ultraviolet light with an operating wavelength λ of 157 nm and which, in the case of other embodiments, can also lie thereabove, for example at 193 nm or 248 nm, or therebelow. A downstream illuminating system 4 generates a large, sharply delimited and homogeneously illuminated image field which is adapted to the telecentricity requirements of the downstream projection objective 5. The illuminating system has devices for selecting the illumination mode and can, for example, be switched between conventional illumination with a variable degree of coherence, angular field illumination and dipole or quadrupole illumination.

A device 6 for holding and manipulating a mask 7 is arranged behind the illuminating system such that the mask lies in the object plane 8 of the projection objective and, for the purpose of scanner operation, can be moved in this plane in a traversing direction 9 (y-direction) by means of a scan drive.

Following behind the mask plane 8 is the projection objective 5, which acts as reduction objective and images an image of a pattern arranged on the mask at a reduced scale, for example the scale 1:4 or 1:5, onto a wafer 10 which is coated with a photoresist layer and is arranged in the image plane 11 of the reduction objective. Other reduction scales are possible, for example stronger reductions of down to 1:20 or 1:200.

The wafer 10 is held by a device 12 which comprises a scanner drive, in order to move the wafer synchronously with the reticle 7 and parallel to the latter. All the systems are controlled by a control unit 13.

The projection objective 5 operates with geometrical beam splitting and has between its objective plane (mask plane 8) and its image plane (wafer plane 11) a catadioptric objective part 15 having a first deflecting mirror 16 and a concave mirror 17, the plane deflecting mirror 16 being tilted to the optical axis 18 of the projection objective in such a way that the radiation coming from the objective plane is deflected by the deflecting mirror 16 in the direction of the concave mirror 17. In addition to this mirror 16 required for the projection objective to function, a second, plane deflecting mirror 19 is provided which is tilted to the optical axis in such a way that the radiation reflected by the concave mirror 17 is deflected by the deflecting mirror 19 in the direction of the image plane 11 to the lenses of the downstream, dioptric objective part 20. The mutually perpendicular, plane mirror surfaces 16, 19 are provided on a beam deflecting device 21 (FIG. 2) designed as a reflecting prism, and have parallel tilting axes perpendicular to the optical axis 18. It is possible for the mirrors 16, 19 to be designed as mirrors physically separated from one another.

The spherically curved concave mirror 17 is arranged at the end of an obliquely positioned side arm 25. The oblique positioning of the side arm can ensure, inter alia, an adequate working distance over the entire width of the objective. In a corresponding way, the setting angle of the deflecting mirrors 16, 19, of which the planes are perpendicular to one another, can deviate by several degrees from 45° in relation to the optical axis 18.

In the example shown, the catadioptric objective part is designed so as to produce in the region of the second deflecting mirror 19 an intermediate image which preferably does not coincide with the mirror plane, but can lie either therebehind or in front thereof in the direction of the concave mirror 17. The projection objective 5 therefore has two pupil planes, one pupil plane 35 lying in the immediate vicinity of the concave mirror 17, and one pupil plane 40 lying in the refractive objective part 20.

A particular feature of the objective design consists in that there is arranged in a region, traversed twice by the light, between the beam deflecting device 21 and the concave mirror 17 in the obliquely positioned side arm 25 of the objective immediately in front of the concave mirror 17 a birefringent transmission element 30 which, in conjunction with the concave mirror 17, forms a reflective retardation arrangement 50 which has a spatially varying retardation action over its useful cross section. The retardation arrangement 50 serves, on the one hand, as a polarization-rotating device which effects a global rotation of the preferred polarization direction of the light by approximately 90° in the light path between the first and the second deflecting mirror 16 and 19, respectively. Moreover, it acts as a compensation arrangement which effects a location-dependent setting of the polarization state over the cross section of the radiation beam by means of the spatially varying retardation effect. The aim is explained in more detail below.

Figure 2:
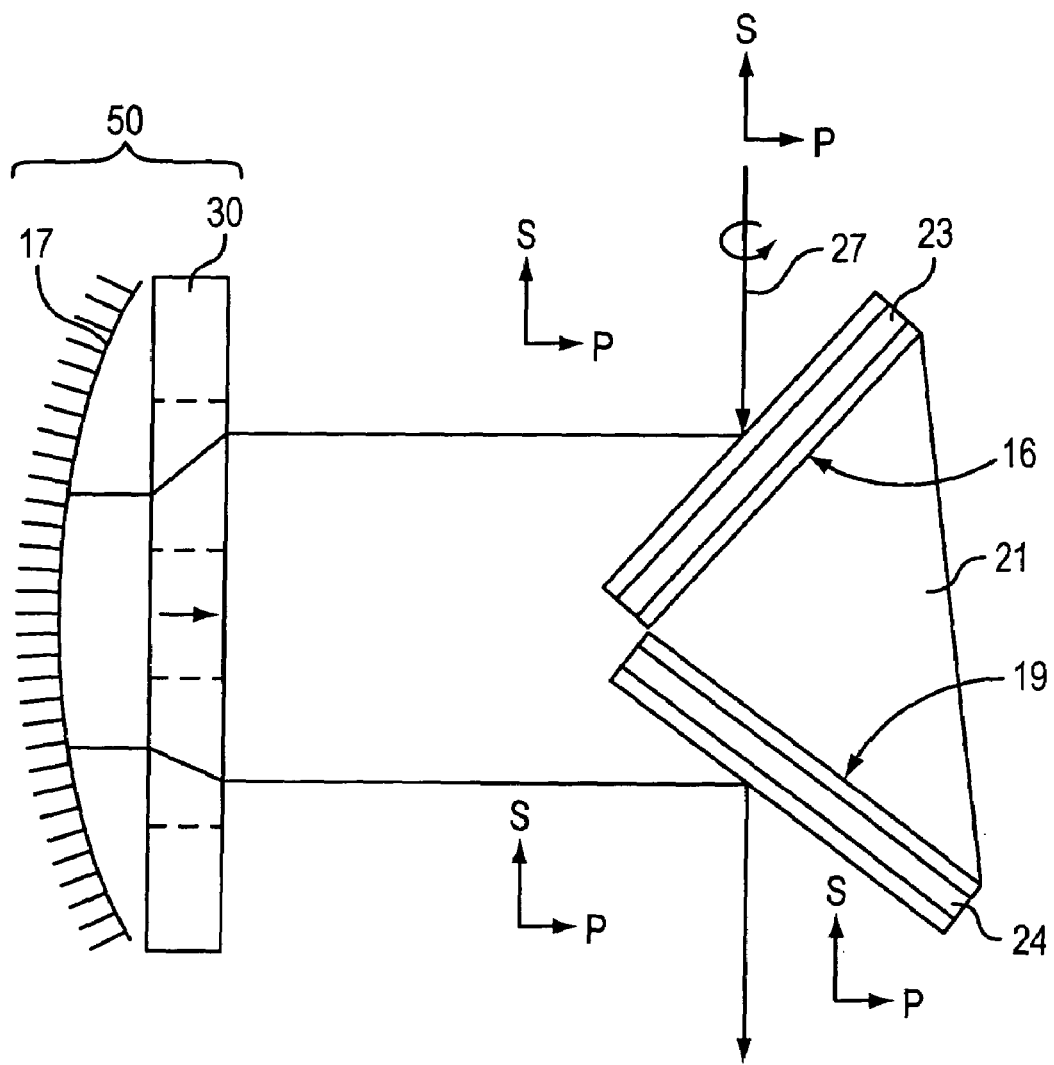
FIG. 2 is a diagrammatic detailed view of the catadioptric objective part of the projection objective shown in FIG. 1.

The reflecting surfaces of the deflecting mirrors 16, 19 are coated with highly reflective coatings 23, 24 in order to achieve a high reflection factor (FIG. 2). These comprise one or more layers made from dielectric material and whose refractive indices and layer thicknesses are selected so as to produce an amplification of reflection in the range used for the angle of incidence.

These layers lead to a phase difference, dependent on the angle of incidence and polarization between the field components, aligned perpendicular to one another, of the electric field vector of the reflected light (s-polarization and p-polarization, respectively). This arises because the layers for s- and p-polarization constitute a different optical path as a function of the angle of incidence of the rays, depending on the angle of incidence. Moreover, conventional multiple layers have different reflection factors for s- and p-polarization, depending on the angle of incidence. With conventional reflective layers, the reflection factor for s-polarization is frequently greater over the entire angular range than for p-polarization, particularly strong differences in reflectivity possibly resulting in the region of the Brewster angle lying at approximately 45°.

These effects of amplitude and phase can lead, on the one hand, to the fact that the p-components of the electric field are more strongly attenuated during passage through the objective than the s-components, and so, for example in the case of entrance-side, unpolarized or circularly polarized light, the light striking the image plane has a stronger s-component. On the other hand, varying polarization states can occur over the beam cross section. Differences in resolution which are dependent on structural direction can thereby occur.

These problems are avoided in the case of the embodiment shown by virtue of the fact that the polarization of the light is rotated globally by approximately 90° overall with the aid of the reflective retardation arrangement 50 between the deflecting mirrors 16, 19 and, in addition, a location-dependent correction of polarization states is introduced in the region of the pupil plane 35.

Shown in FIG. 2 by way of explanation is an example in which the input light 27 striking the first deflecting mirror 16 is circularly polarized, the amplitudes, symbolized by the arrow lengths, of s-polarization and p-polarization being substantially equal. After reflection at the obliquely positioned mirror 16, the component, oscillating parallel to the incidence plane, of the electric field is more strongly attenuated than the s-component. This light traverses the birefringent transmission element 30, which is designed as a modified λ/4 plate and retards the phases of the field components by a quarter wavelength relative to one another in the case of a single passage over the entire useful cross section and, moreover, introduces further small phase retardations (<<λ/4) as a function of location, if appropriate. After reflection at the concave mirror 17, in the case of which the polarization state remains substantially unaltered, the reflected light passes again through the transmission element 30, which is thereby traversed twice, a further phase retardation by approximately λ/4 taking place in addition to possible small location-dependent positive or negative retardation contributions. The double passage through the plate 30 thus leads overall to a λ/2 retardation which corresponds to a rotation of the preferred polarization directions by 90°, and to a further retardation, which varies over the cross section and, in terms of magnitude, is small, as a rule, by comparison with the main retardation (for example less than 10-20% of λ/4) and is superimposed thereon. The variation can be set by means of a different effect of inclination and/or direction of inclination of the transit direction produced by the deflecting structures.

As a result of this, on the one hand the light which is s-polarized with reference to the second deflecting mirror 19 has the (weaker) amplitude of the component which is p-polarized downstream of the first deflecting mirror, while the p-component now has the greater amplitude. On the basis of the differences, explained above, in reflectivity, this p-component is now more strongly attenuated than the (weaker) s-component, and so a matching of the amplitudes occurs for s- and p-polarization. The multiple layers 23 and 24 are advantageously designed such that substantially the same amplitudes of s- and p-polarization occur downstream of the second deflecting mirror 16. Imaging without contrast differences dependent on structural direction is thereby possible with the aid of this light.

In addition, a location-dependent polarization correction is introduced in the region of the pupil plane 35, it being possible thereby to compensate any variations in polarization dependent on the angle of incidence which may occur near the field.

Figure 3:
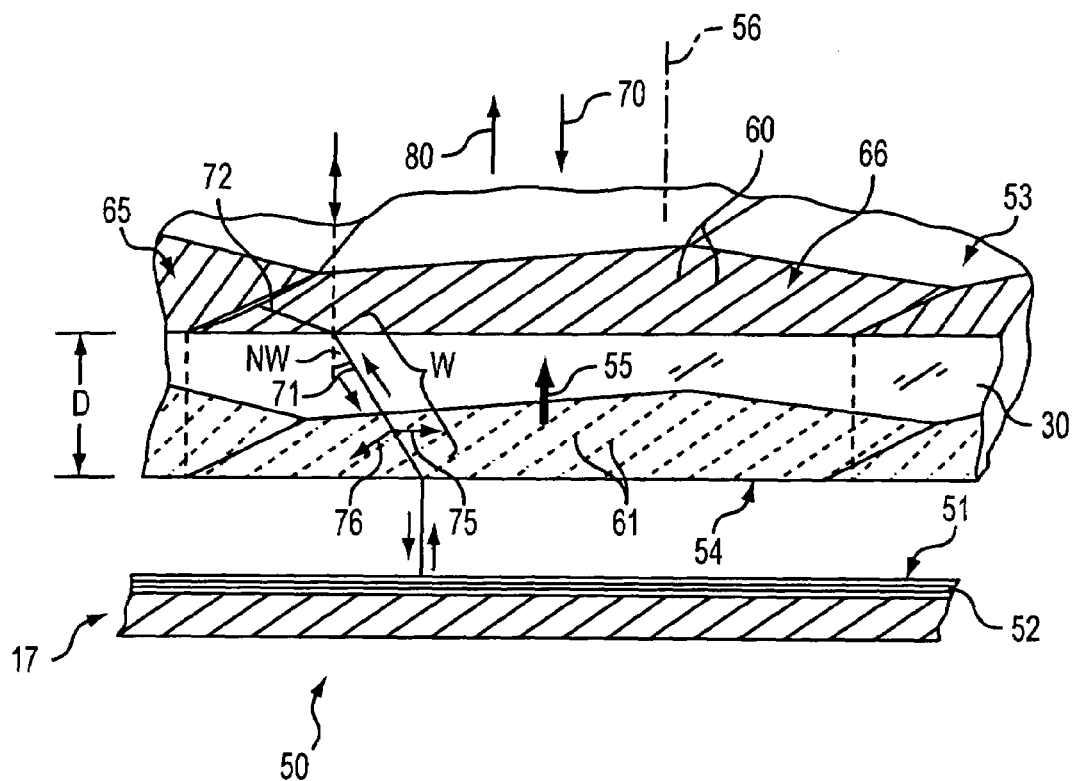
FIG. 3 is a diagrammatic detailed view of an embodiment of a reflective retardation arrangement.

FIG. 3 shows a diagrammatic, detailed view of the retardation arrangement 50. It substantially comprises the birefringent transmission element 30 and the concave mirror 17 arranged immediately behind it, the multilayer reflective coating 52 of the mirror surface 51 of which mirror lies a short distance behind the exit side 54, lying opposite the entrance side 53 of the retardation arrangement, of the plate 30. The transparent, birefringent plane-parallel plate 30 consists of a single, anisotropic crystal having one optical axis and whose main crystallographic axis 55 is substantially perpendicular to the plane-parallel plate surfaces 53, 54 and parallel to the optical axis 56 of the retardation arrangement 50. The material of the plate is transparent to light of the operating wavelength provided, preferred operating wavelengths lying in the UV region with wavelengths below approximately 260 nm. The unipartite plate 30 can, for example, consist of magnesium fluoride for light of wavelength 157 nm, and of magnesium fluoride or quartz (silicon dioxide) or of mechanically strained calcium fluoride or quartz for light of wavelength 193 nm. The plate 30 is installed in the beam path of the radiation to be influenced in such a way that the main crystallographic axis 55 is parallel to, or the plate faces 53, 54 are perpendicular to the optical axis 18 of the projection objective. In the case of strained plates, the function of the main crystallographic axis is replaced by the main axis induced by the strain. The axial thickness D of the plate is typically of the order of magnitude of several tenths of a millimetre and can, if appropriate, be so large that the plate can be installed in a self-supporting fashion (for example approximately 0.5 mm-10 mm). It is also possible for the purpose of supporting the plate to provide a carrier made from isotropic transparent material (for example silica glass or calcium fluoride), against which the plate bears.

Constructed on the entrance side 53 and the exit side 54 of the plate are mutually assigned, deflecting structures 60, 61 having deflecting properties coordinated with one another. In the case of the example, the deflecting structures are present in the form of hexagonal areas of the same size which cover the entire entrance side 53 and exit side 54 in a fashion filling the surface. A deflecting structure acting in the manner of a blazed grating is provided in each hexagonal area, the alignments of the parallel grating structures generally differing by a few degrees of angle between neighbouring retardation zones 65, 66. The deflecting structures define retardation zones which are directly neighbouring and have a different retardation effect. The zone boundaries between the retardation zones are indicated by dashed lines.

The mode of operation of the transmission element 30 will now be explained in more detail with the aid of the mutually assigned diffractive structures 60 (on the entrance side 53) and 61 (on the exit side 54), which are slightly laterally offset from one another. The light (input radiation beam 70) incident parallel to the optical axis of the system strikes the deflecting structure 60 on the input side 53. This transmission grating deflects the radiation by diffraction such that the transit direction 71 of the first order of diffraction inside the crystal plate 30 runs obliquely relative to the main crystallographic axis 55. Here, "oblique" denotes any transit direction which is neither parallel nor perpendicular to the main crystallographic axis 55. Such transit directions are characterized by an angle of inclination NW of more than 0° and less than 90°. On the basis of the same grating constant as the input structure 60, the diffractive structure 61 on the output side 54 cancels this deflection again, and so the emerging light 67 emerges parallel to the optical axis of the system in a fashion offset in parallel with the corresponding incident light. These relationships are exaggerated in the drawing of FIG. 3. The direction of the main crystallographic axis 55 and the transit direction 71 span a transit plane which defines the direction of inclination and whose intersection 72 with the entrance side 53 of the plate runs perpendicular to the lines of the deflecting grating structure 60. The path length W covered by the light inside the crystal in the transit direction 71 is dependent in accordance with W=D/cos (NW) on the plate thickness D and the angle of inclination NW.

Figure 4:
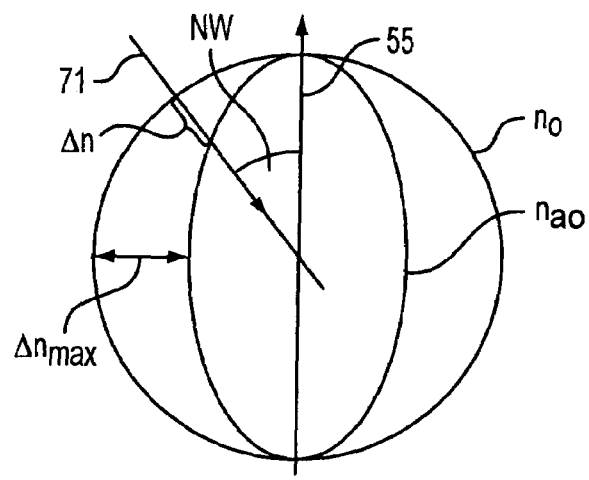
FIG. 4 is a diagram for explaining the mode of operation of the retardation arrangement of FIG. 3.

On the basis of the birefringent properties of the plate material, a light wave propagates inside the plate 30 with two orthogonal directions of oscillation, that is to say in the form of field components which are polarized perpendicular to one another, the direction of oscillation 75 of one component running in the transit plane, and the direction of oscillation 76 of the other component running perpendicular to the transit plane. For the purposes of this application, the component 75 oscillating in the transit plane is denoted as ordinary ray (index o), and the component 76 oscillating perpendicular thereto is denoted as extraordinary ray (index ao). In the case of birefringent materials, different refractive indices $n_o$ for the ordinary ray and $n_{ao}$ for the extraordinary ray hold in general for these two components as a function of the transit direction. Their ratio is shown diagrammatically in FIG. 4 for the case of a negatively birefringent crystal. As is generally known, the refractive index $n_o$ is the same in all directions, while the refractive index $n_{ao}$ changes as a function of the angle NW to the main crystallographic axis 55. This split ($n_{ao}=n_o$) vanishes in the direction of the main crystallographic axis 55, while the difference in magnitude $\Delta n=|n_{ao}-n_o|$ is at a maximum ($\Delta n_{max}$) perpendicular thereto. As is known from the theory of retardation plates, the two field components polarized perpendicular to one another leave the birefringent material without a difference in direction, but with a path difference G in accordance with $G=W \cdot x|n_{ao}-n_o|$.

After the first passage through the plate 30, the emerging light 67 strikes the reflecting surface 51 of the concave mirror 17 and is retroreflected by the latter substantially in the opposite direction in the direction of the plate 30. The deflecting structures 61 at the exit side 54 thereof deflect the radiation such that it passes through the plate again in a fashion substantially parallel to the transit direction 71 and thus obliquely relative to the main crystallographic axis 55 (reciprocity law). In the case of emergence from the entrance side 53 of the plate, the deflecting structures 60 there ensure that the emerging light (output beam 80) runs back in a fashion substantially parallel to the entering light 70 in the direction of the beam deflecting device 21. In the case of the second passage through the birefringent transmission plate 30, a path difference G of the orthogonal field components is produced again such that the retardation produced overall corresponds substantially to twice the path difference G.

Such an arrangement produces the desired distribution of locally different polarization states solely by the retardation effect on the input radiation, and not by filtering. A high transmission efficiency is thereby achieved.

A particular feature of the retardation arrangement consists in that the angle of inclination NW can be set within certain limits by the dimensioning or design of the deflecting structures, the angle of inclination increasing in the case of the linear grating structure shown the smaller the grating constant (spacing between neighbouring grating lines perpendicular to the course of the lines). It may be seen from FIG. 4 that, in the range of small angles of inclination, that is to say when the transit direction 71 is at a very sharp angle to the main crystallographic axis 55, the difference in refractive index $\Delta n$ can assume very small values which are only a fraction of the maximum difference in refractive index $\Delta n_{max}$ which would occur given a right angle between the direction 71 of light propagation and the main crystallographic axis 55. The possibility, created by the invention, of setting very small differences in refractive index (for a given plate material) leads to the fact that the plate thickness D required for a desired path difference G in the polarization components at the output of the plate 30 can be higher by a multiple in the case of inventive retardation arrangements than in the case of conventional retardation plates for which the direction of incidence of the light is perpendicular to the main crystallographic axis 55. Consequently, inconveniently small thicknesses of birefringent plates can be avoided by the invention, and this has an advantageous effect, in particular, concerning the use of large cross sections. The direction of inclination can also be set in a targeted fashion by means of the deflecting structures.

In the embodiment shown in FIG. 3, the plate thickness D and the angle of inclination NW are selected (by means of suitable grating constants of the deflecting gratings) such that, during the first passage, a path difference G of approximately a quarter of the wavelength of the incident light 70 results along the path W between the field components 75, 76 of the transiting light. As a result, by analogy with a quarter-wave plate, incident circularly polarized light is converted into emerging linearly polarized light. The circularly polarized light is retroreflected by the concave mirror 17 and experiences a $\lambda/4$ retardation again on the return path, that is to say during the second passage through the plate 30, and so it leaves the retardation arrangement in a substantially circularly polarized fashion in each of the retardation zones 65, 66.

The orientation of the preferred polarization direction of each zone downstream of the mirror-side exit from the retardation arrangement can be influenced for each zone by the orientation of the deflecting structures. Their orientation defines the orientation of the transit plane for each zone, that is to say locally, and therefore also the orientation of the directions 75, 76 of oscillation of the field components polarized perpendicular to one another. These directions 75, 76 are also denoted as induced crystal axes.

The reflective retardation arrangement 50 thus effects a $\lambda/2$ phase retardation to a first approximation between the light of the input radiation beam 70 and the light of the output beam 80. However, a local variation in the retardation effect over the useful cross section can be set in addition by the retardation zones 65, 66 distributed over the cross section. For this purpose, the deflecting structures in the individual hexagonal cells 65, 66 can be set such that small deviations can result locally in the overall $\lambda/2$ retardation described. Since this spatially resolving influencing of the polarization states takes place in the vicinity of a pupil plane 35 of the projection objective, it is possible to compensate polarization inhomogeneities which occur as a function of beam angle in the region of a field plane of the projection objective (compare explanations relating to FIG. 6).

There are also embodiments which serve exclusively as compensation means. With these, the retardation action varying over the useful cross section can be over-whelmingly or largely small in terms of absolute magnitude by comparison with $\lambda/4$. This is possible, for example, through appropriately smaller plate thicknesses of the transmission element and/or through setting smaller angles of inclination.

Retardation arrangements of the type described can be produced cost-effectively and with high quality. Starting crystals made from silicon dioxide or magnesium fluoride for producing the birefringent plate are available precisely in the required orientation of the main crystallographic axis and also with large dimensions up to, for example, diameters of 20 or 30 cm, in particular for silicon dioxide. All that is required to produce a retardation arrangement is to process a plate which, because of the typical thickness of a few tenths of a millimetre, is relatively insensitive and can be effectively manipulated during processing. The production of the deflecting, that is to say diffractive and/or refractive structures on the plate surfaces can be performed with the aid of suitable lithographic processes, and so the costs of preparation can remain low in conjunction with large piece numbers. Mechanical production of the structures is also possible in principle.

Figure 5:
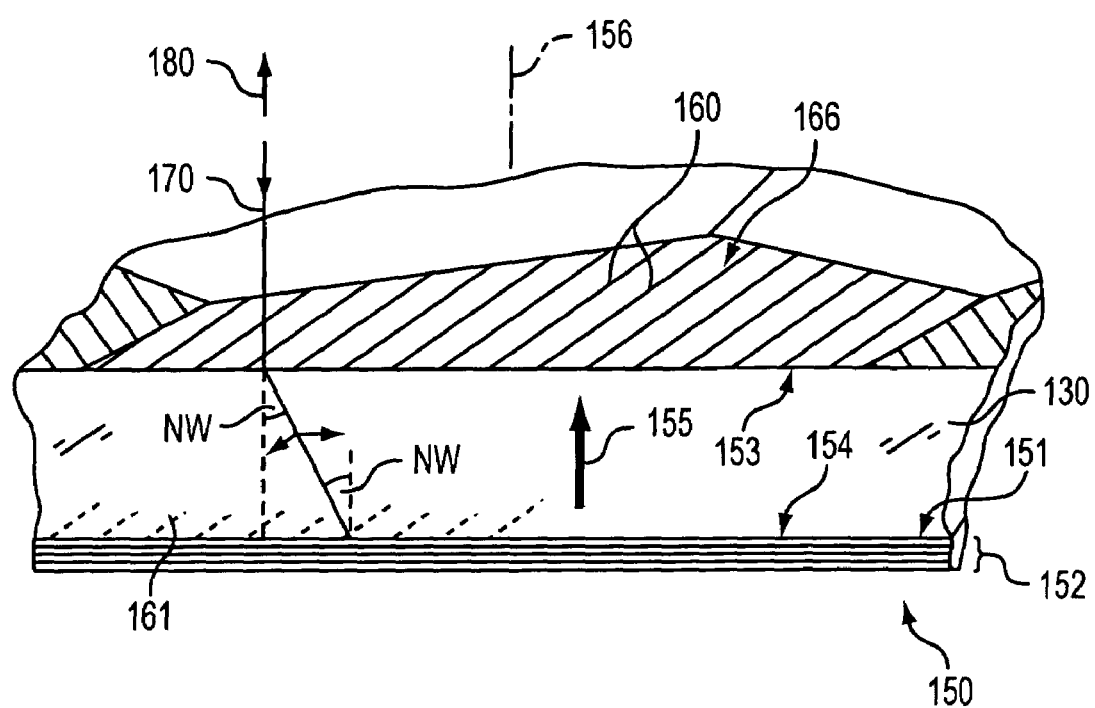
FIG. 5 is a diagrammatic detailed view of another embodiment of a reflective retardation arrangement.

Another embodiment of a reflective retardation arrangement 150 is shown diagrammatically in FIG. 5. The design exhibits similarities with the retardation arrangement 50 in FIG. 3, for which reason corresponding reference numerals increased by 100 are selected for corresponding features. The retardation arrangement comprises a unipartite plane-parallel transmission plate 130 made from birefringent material whose main crystallographic axis 155 is perpendicular to the planes of the plates or parallel to the optical axis 156 of the retardation arrangement. Hexagonal cells with deflecting structures of the above-described type are formed on the entrance side 153. A multilayer reflective coating 152 is applied directly to the plate surface 154 lying opposite the entrance side 153. Deflecting structures 161 are provided on the side 154 of the plate 130 facing the reflecting surface 151 in a way similar to the case of the embodiment in accordance with FIG. 3.

The input beam 170 incident in a fashion substantially parallel to the optical axis of the retardation arrangement is deflected at the entrance-side deflecting structures 160 of the retardation zone 166 into a transit direction running obliquely relative to the axis 155, the result being in accordance with the above explanation, a phase retardation in the first passage up to the reflecting surface 154 as a function of plate thickness D and angle of inclination NW. The radiation is reflected at the reflecting surface 154, the deflecting structures 161 ensuring that the radiation is retroreflected into itself. In a second passage, the retroreflected radiation traverses the plate 130 at substantially the same angle of inclination to the crystallographic axis 155 until it strikes the deflecting structures 160 which are provided on the entrance side and deflect it into an output beam 180 having a direction of departure running substantially parallel to the direction of incidence.

The reflective retardation arrangement 150 having a retardation effect possibly varying in a spatially resolving fashion can have a curved shape in order, for example, to serve inside a catadioptric projection objective as a concave mirror which simultaneously has a retardation effect, varying over its cross section, on the reflected radiation. An exemplary use is explained in more detail with the aid of FIG. 6.

Figure 6:
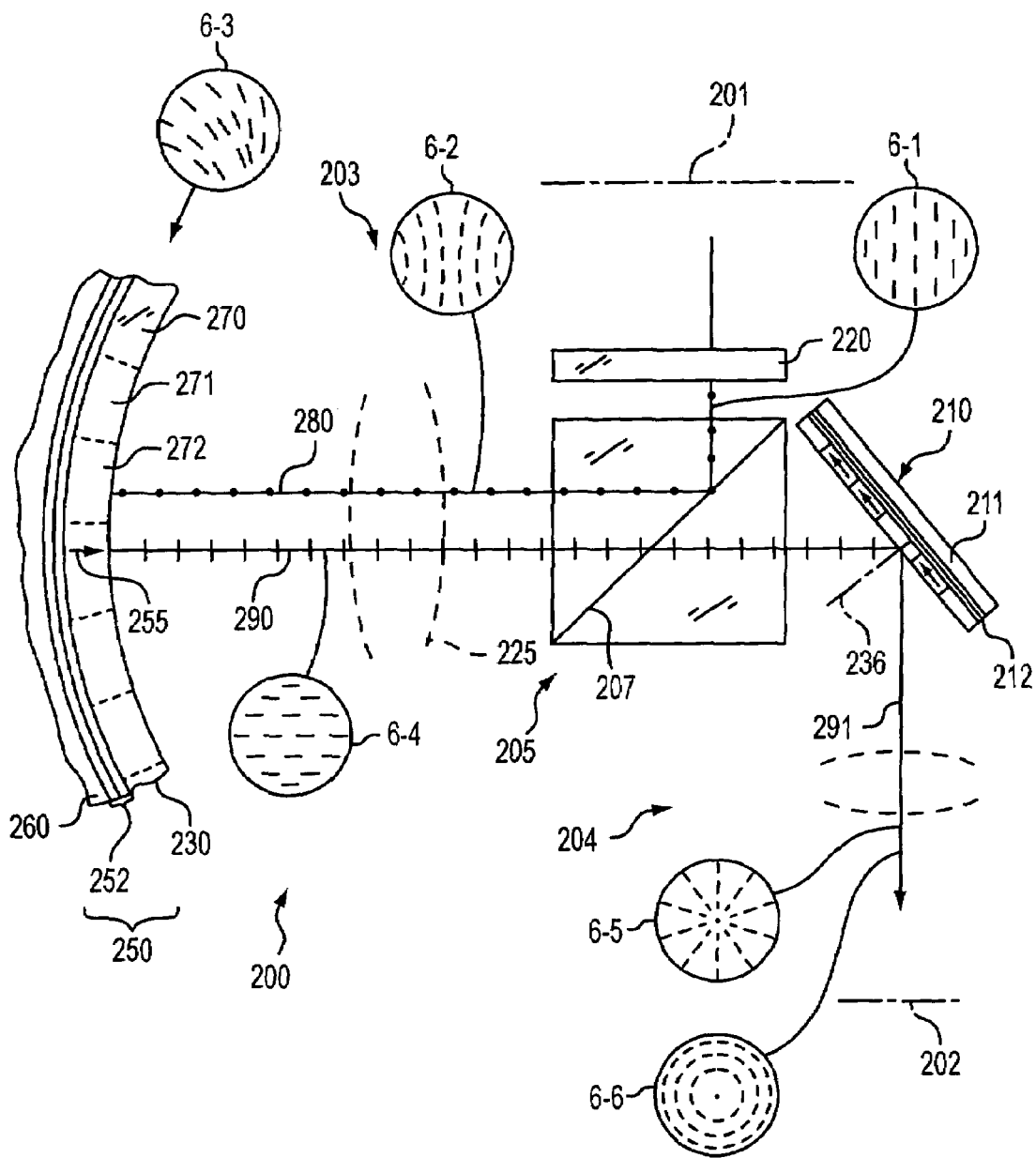
FIG. 6 is a diagrammatic illustration of a catadioptric projection objective utilizing physical beam splitting (polarization beam splitting) in accordance with an embodiment of the invention.

FIG. 6 shows a diagram of the design of a catadioptric projection objective 200 having a polarization beam splitter. It serves the purpose of imaging a pattern, arranged in its object plane 201, of a reticle or the like into its image plane 202 at a reduced scale, for example in the ratio 4:1, while producing exactly one real intermediate image (not shown). The projection objective designed for an operating wavelength of $\lambda=157$ nm has between the object plane and the image plane a first, catadioptric objective part 203 and, downstream thereof, a second, purely dioptric objective part 204. The catadioptric objective part comprises a physical beam splitter 205 with a flat polarization beam splitter surface 207, aligned obliquely relative to the optical axis, as well as a mirror group with an imaging concave mirror or hollow mirror 250 which serves simultaneously as a spatially varying reflective retarder (that is to say as a retardation arrangement with a locally varying retardation effect). The second objective part 204, which acts to reduce, has a flat deflecting mirror 210 which is inclined to the optical axis and, in conjunction with the reflection at the beam splitter surface 207, permits the mask arranged in the object plane to be aligned parallel with a photosensitive substrate arranged in the image plane 202, for example with a semiconductor wafer coated with a photoresist layer. This facilitates a scanner operation of mask and wafer. Embodiments without deflecting mirror, or variants with more than one deflecting mirror are also possible.

Characteristic of projection objectives of this type is the operation with polarized ultraviolet light (linearly or circularly polarized in the respective objective regions), the polarization state being adapted to the properties of the beam splitter layer 207. The polarization-selective beam splitter layer is intended to pass essentially one polarization direction and to block the others. The roles of the polarization components (components of the electric field vector perpendicular and parallel, respectively, to the respective plane of incidence onto an optical component) are interchanged in this case depending on whether the beam splitter layer 207 is used in transmission or in reflection.

Multilayer dielectric antireflection interference layer systems (AR layers) are coated on all entrance surfaces and exit surfaces of the lenses and of the polarization beam splitter, in order to improve the transmission of the objective. The reflecting surfaces of the mirrors 250, 210 are coated with highly reflecting dielectric reflection interference layer systems (HR layers) 252, 212.

The concave mirror arrangement 250 is a particular feature of this system. It comprises a spherically curved mirror substrate 260, having a multilayer reflective coating 252 applied to the concave side, as well as a spherically curved birefringent transmission element 230 applied directly to the reflective coating 252. Over its entire useful cross section, the transmission element 230 has approximately the retardation action of a $\lambda/4$ plate, there being superimposed on this global retardation effect a further retardation effect, which varies in a spatially resolving fashion and is small by comparison with $\lambda/4$ in each of the various retardation zones 270, 271, 272. For this purpose, the concave mirror arrangement 250 is designed by analogy with the retardation arrangement 150 in FIG. 5. Thus, at the entrance surface facing the beam splitter it has, for each of the retardation zones 270, 271, 272, deflecting structures which in each case deflect the incident radiation locally into an oblique direction relative to the main crystallographic axis 255 of the transmission plate 230. Moreover, deflecting structures which effect a retroreflection of the reflecting beams into themselves are formed at the mirror-side exit of the transmission element 230.

Figure 7:
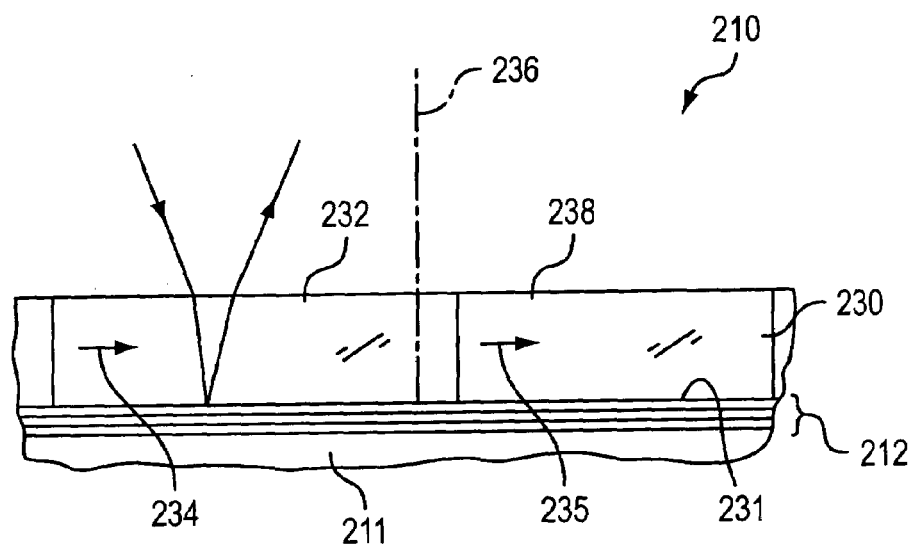
FIG. 7 is a diagrammatic detail of a deflecting mirror, acting as retardation arrangement, of the projection objective in FIG. 7.

The projection objective 200 is designed for operating with circularly polarized input light which is provided by an illuminating system arranged above the object plane 201. After passage through the mask, arranged in the object plane, and a $\lambda/4$ plate 220 arranged downstream thereof, the light is s-polarized with reference to the beam splitter layer 207, and is reflected by the latter in the direction of the concave mirror arrangement 250. After passage through one or more diagrammatically indicated lenses 225, the input radiation beam 280 strikes the birefringent transmission element 230. During the first passage through the transmission element, a phase retardation of $\lambda/4$ essentially occurs over the entire useful cross section between the field components, and so radiation strikes the reflective coating 252 in a largely circularly polarized fashion and is retroreflected thereby in the direction of the beam deflecting device. A further λ/4 retardation is introduced in the second passage through the transmission element 230, and so the output radiation beam running from the concave mirror arrangement 250 to the beam splitter 205 is p-polarized with reference to the beam splitter layer 207 after a second passage through the transmission element 230. The p-polarized light is now transmitted by the beam splitter layer 207 and strikes the deflecting mirror 210 by which it is deflected in the direction of the image plane 202. Particular features of this mirror 210 are explained in more detail below in conjunction with FIG. 7.

The polarization discrimination described is, ideally, a perfect one, and the light striking the individual optical components or passing through the latter has the respectively desired polarization state. However, an undesired variation in the polarization state can occur over the cross section of the radiation beam owing to polarization-dependent effects of the interference layer systems extending over the angle of incidence used, owing to strain-induced and/or intrinsic birefringence of the transparent optical components and/or owing to geometrical effects.

With conventional systems, this can have the effect, for example, that the light retroreflected by the concave mirror in the direction of the beam splitter is not perfectly p-polarized, but also has other polarization components in subregions of the beam cross section. The beam splitter layer is not perfectly transmitting for these other polarization components, and so it is possible at the beam splitter layer for retroreflection of light fractions in the direction of the mask to occur, on the one hand, and for the radiation transmitted to the deflecting mirror to be unevenly polarized over the cross section, on the other hand.

In the embodiment, these problems are avoided by designing the concave mirror arrangement 250 simultaneously as a reflective retardation arrangement having a retardation effect varying over its cross section. Here, in the case of the example, the retardation effects of the individual retardation zones 270, 271, 272 are adapted to the remainder of the system such that the radiation reaching from the mirror arrangement 250 to the beam splitter is virtually perfectly p-polarized over the entire cross section even if the input radiation 280 for the concave mirror has a variation in polarization state over its cross section. It is thereby possible to use the beam splitter 205 with an optimum transmission efficiency.

For the purpose of an exemplary explanation, the local distributions of the polarization state over the beam cross section at the corresponding locations of the beam path are illustrated diagrammatically in FIG. 6 in Sub-FIGS. 6-1, 6-2 and 6-4. Sub-FIG. 6-3 shows diagrammatically the local variation in the retardation effect of the retardation arrangement 250 over the useful cross section, in order to change the "distorted" spatial distribution of the preferred polarization direction in Sub-FIG. 6-2 (that is to say upstream of the concave mirror) into a uniform polarization downstream of the concave mirror (Sub-FIG. 6-4). Before entry into the beam splitter 205, the radiation is uniformly linearly polarized over the entire radiation beam cross section, specifically with s-polarization with reference to the incidence plane (Sub-FIG. 6-1). Because the beam splitter surface exerts a polarization effect dependent on the angle of incidence, after reflection at the said surface, a variation in the preferred direction of the polarization which depends on location results (Sub-FIG. 6-2). In order to compensate this distortion, and to return to a uniform polarization over the cross section, the direction of the crystallographic axes effective for the retardation effect (dashes in Sub-FIG. 6-3) within the retardation zones 270, 271, 272 of the retardation arrangement 250 are locally aligned in each case at 45° to the locally incident polarization direction. This is achieved by suitable design of the diffractive structures of the exposed entrance surface and of the exit surface, facing the reflection coating 252 of the transmission element 230. These are designed in a fashion varying over the cross section in such a way that the output radiation beam 290 is polarized perpendicular to the distribution of polarization in accordance with Sub-FIG. 6-2 (Sub-FIG. 6-4). It is thereby possible to achieve a virtually complete transmission, uniform over the beam cross section, of the radiation beam in the direction of the deflecting mirror 210 without radiation losses dependent on location.

Although the deflection mirror 210 can be designed as a "normal" deflecting mirror with a highly reflecting reflective coating, in the case of the embodiment of the deflecting mirror 210 shown, the deflecting mirror 210 is likewise designed as a reflective retardation arrangement having a retardation effect which varies spatially over its useful cross section, in order to form an output radiation beam 291 with a cylindrically symmetrical distribution of polarization state (radial or tangential) in a largely loss-free fashion from the input radiation beam 290, p-polarized with reference to the reflecting surface, in the course of the deflection. Design and function are explained in more detail with the aid of FIG. 7.

The deflecting mirror 210 designed as a reflective retardation arrangement having a retardation effect varying in a spatially resolving fashion comprises a birefringent transmission element 230 in the form of a plane-parallel plate on the rear side 231 of which, lying opposite the input radiation, a highly reflecting multilayer reflective layer system 212 is applied. The whole is applied to a mechanically and thermally stable mirror substrate 211. The transmission element 230 has a multiplicity of hexagonal plates 232, 233 made from birefringent material which are arranged in a surface-filling fashion and whose main crystallographic axes 234, 235 run perpendicular to the optical axis 236 of the retardation arrangement or parallel to the flat plate surfaces.

Figure 8:
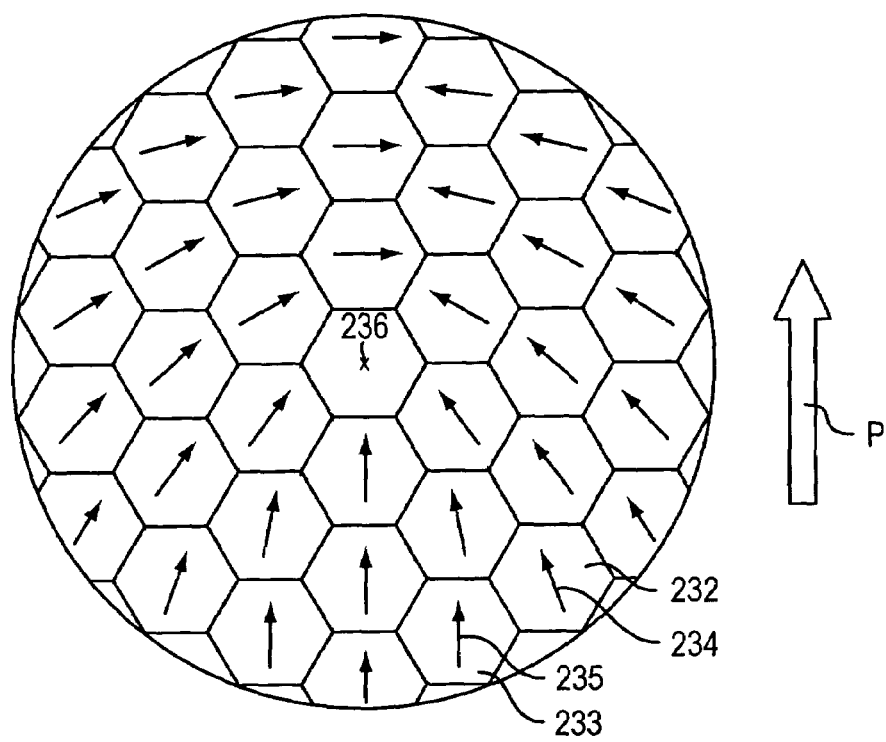
FIG. 8 is a diagrammatic top view of the retardation arrangement in accordance with FIG. 7.

The main axes 234, 235 of the cells or retardation zones 232, 233 are respectively aligned in the direction of the angle bisector between the polarization direction P of the incident radiation, polarized overall in an equally linear fashion, and the respective radius directed towards the optical axis 236, through the middle of each cell (FIG. 8). The thickness of the plate 230 is dimensioned such that a λ/2 retardation is produced overall in the case of oblique transirradiation and two-fold passage. In addition, there is the special feature that a possible retardation by the reflecting layer is incorporated into the design of the birefringent cells. Consequently, upon two-fold passage, each cell effects a rotation of the polarization direction into the direction of the said radius. The reflected output radiation 291 is thus radially polarized.

This effect is shown diagrammatically in the Sub-FIG. 6-5 shown in FIG. 6. Shown in the round cross section of the radiation beam are radially running dashes which represent the locally present preferred polarization direction of the partial radiation beam. Sub-FIG. 6-6 shows the relationships for tangential output polarization.

The grid layout with hexagonal cells is only one exemplary embodiment. Other grid layouts, in particular including fan-type sector divisions of the cells are also a rational possibility.

When the main crystallographic axes of the birefringent cells lie parallel to the surface, the retardation effect upstream and downstream of the reflection is the same as the mirror 212, that is to say the polarization effect on an incident Jones vector $E_i$ is yielded in the Eigensystem of the mirror (sp system) as $$\begin{pmatrix} E_x \\ E_y \end{pmatrix} = J_Z J_S J_Z \begin{pmatrix} E_x^i \\ E_y^i \end{pmatrix} \quad (1)$$

with the diagonal Jones matrix of the mirror $$J_S = \begin{pmatrix} 1 & 0 \\ 0 & \exp\{i\beta\} \end{pmatrix} \quad (2)$$

and the Jones matrix of the cell (of the retardation zone)

$$J_Z = \begin{pmatrix} \cos^2\varphi + \exp\{i\alpha\}\sin^2\varphi & \cos\varphi\sin\varphi(1-\exp\{i\alpha\}) \\ \cos\varphi\sin\varphi(1-\exp\{i\alpha\}) & \sin^2\varphi + \exp\{i\alpha\}\cos^2\varphi \end{pmatrix} \quad (3)$$

Of course, a possible polarizing effect of the mirror (difference in reflectivity for s- and p-polarization) cannot be compensated by the birefringent cells. The latter act only on the phase.

An evaluation of the equations 1-3 for incident linear x-polarization shows that any desired output polarization state can be generated by a suitable parameter combination ($\phi$, $\alpha$, $\beta$). Here, $\beta$ represents the retardation of the mirror, $\alpha$ the retardation of the transmitting plate and $\phi$ the orientation of the main crystallographic axis in the plane.

In order to avoid disturbances through the cell boundaries in the case of oblique incidence, the birefringent layer should be as thin as possible (for example a few µm). If the birefringent cells are made from $MgF_2$, with $\Delta n=0.009$, the thickness required to realize a $\lambda/4$ plate at 45° with $\lambda=193$ nm is approximately 10 µm.

Figure 9:
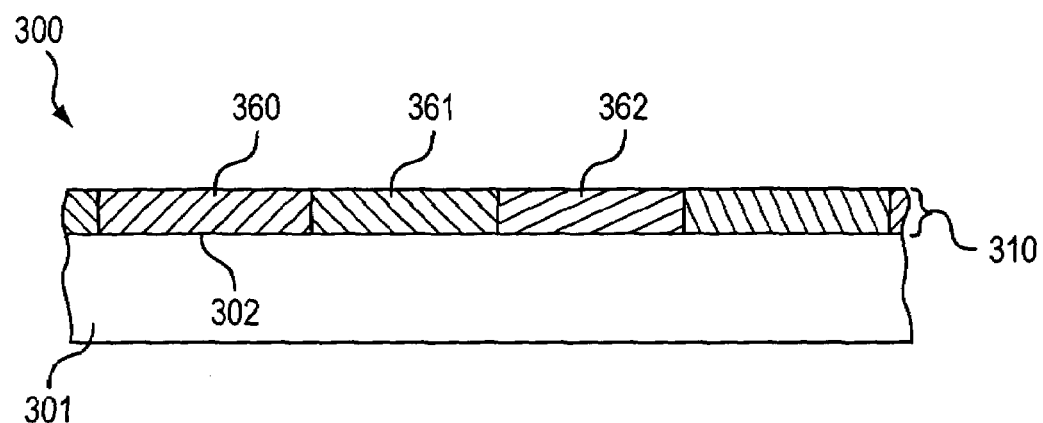
FIG. 9 is a diagrammatic illustration of an embodiment of a front surface mirror having an anisotropic reflective coating.

A further embodiment of a reflective retardation arrangement 300 having a retardation effect varying in a spatially resolving fashion is explained with the aid of FIG. 9. The retardation arrangement 30 comprises a mirror substrate 301 which consists of a material with a low coefficient of thermal expansion, for example of the glass ceramic known under the trade mark of ZERODUR® or of another material with a low coefficient of thermal expansion. A highly reflecting, dielectric multilayer reflective coating system 310 is applied by vapour deposition to a flat substrate surface 302. The reflective coating 310 is an anisotropic coating in the case of which the individual dielectric single layers are designed approximately as $\lambda/2$ layers with different refractive indices. Owing to oblique vapour deposition (typical vapour-incidence angle of 40° or more), the materials of the individual layers have a structurally induced polarization-dependent refractive index. A variation of the anisotropy within the reflecting coating has been produced as a function of location by the coating process, and so there are juxtaposed zones 360, 361, 362 with a different optically polarizing effect. This results over the useful cross section of the retardation arrangement 300 in a local variation in the retardation effect which can be used to set a desired distribution of polarization state over the cross section of the reflected radiation beam.

Figure 10:
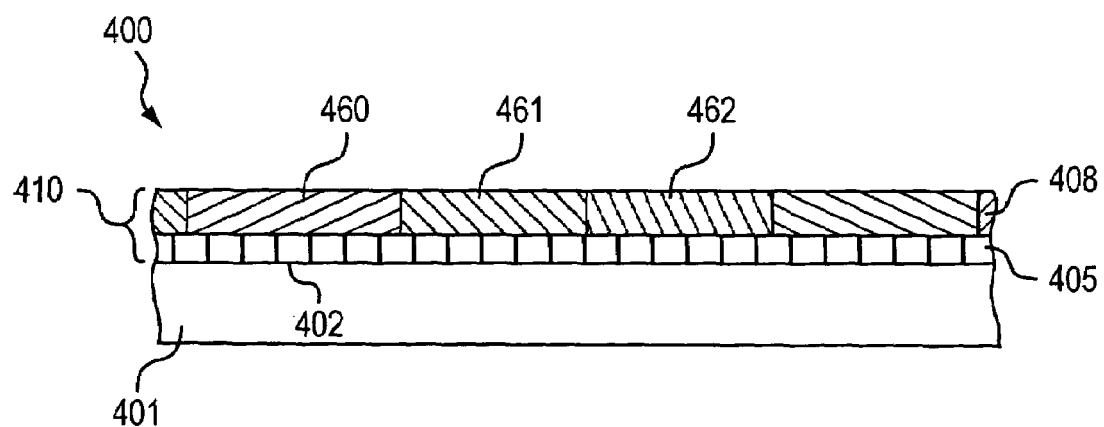
FIG. 10 is a diagrammatic illustration of another embodiment of a front surface mirror having an anisotropic reflective coating.

In the embodiment shown in FIG. 10, the reflective retardation arrangement 400 is designed as a dielectrically reinforced metal mirror. The latter comprises a mirror substrate 401 to whose substrate surface 402 there is applied by vapour deposition, sputtering or in some other way a thin aluminium layer 405 of a few 100 nm. In order to reinforce the broadband reflective effect of the metal layer 405, a dielectric multilayer system 401 is applied which forms the reflective coating 410 together with the metal layer 405. The dielectric multilayer system 408 is designed by analogy with the embodiment shown in FIG. 9 as an anisotropic coating having juxtaposed retardation zones 460, 461, 462 of different retardation effect, the local differences in the polarization and optical effects also being produced here by differences in the anisotropy of the coating.

Mirrors of the type shown in FIGS. 9 and 10 which have a retardation effect varying as a function of location can be used, for example, as flat deflecting mirrors in a projection objective or in an illuminating system of a microlithography projection exposure machine, for example as 90° reflecting mirrors 28 within an illuminating system 4 with a folded beam path (FIG. 1).

Figure 11:
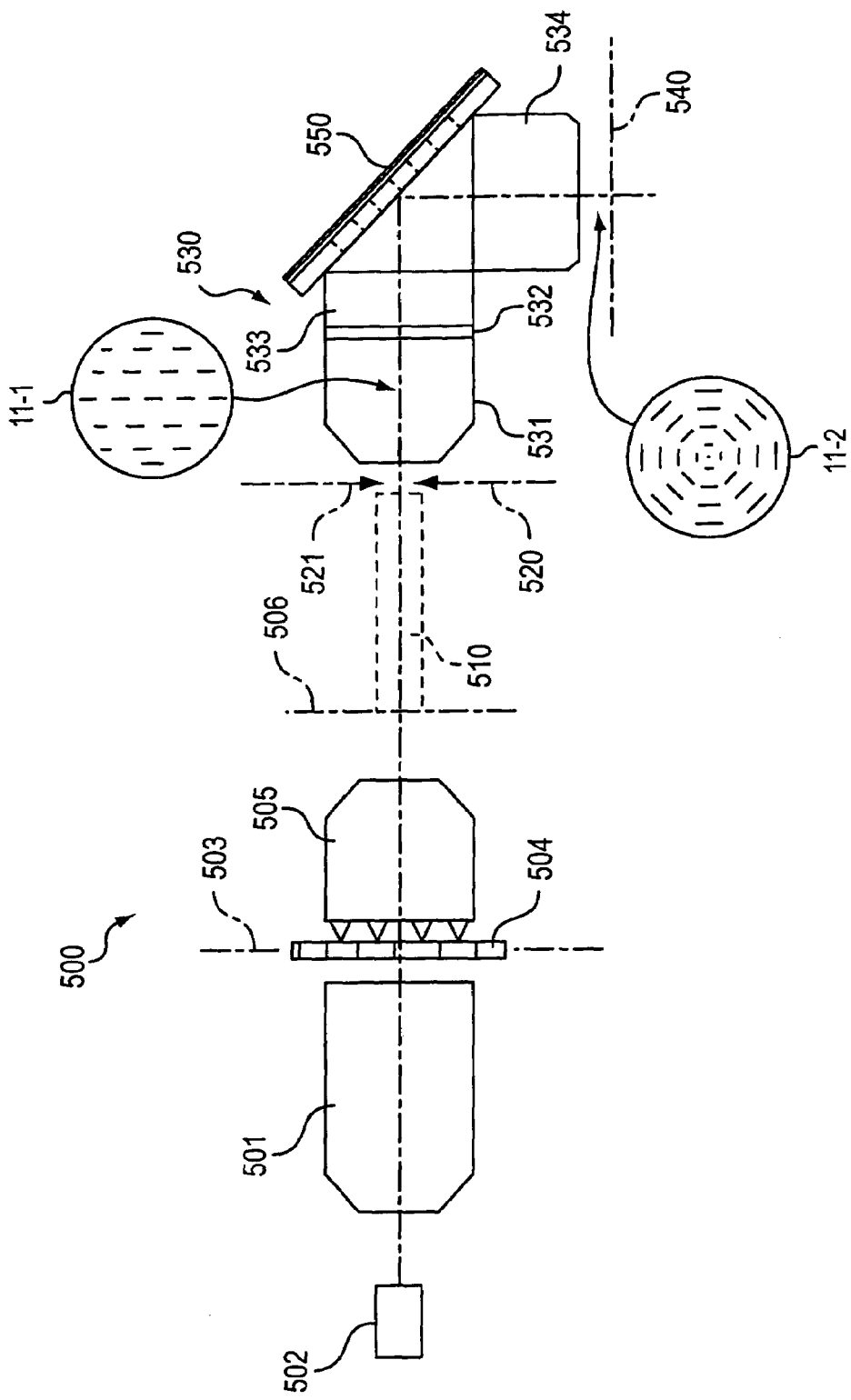
FIG. 11 is a diagrammatic illustration of an embodiment of an illuminating system of a DUV microlithography projection exposure machine having an embodiment of a reflective retardation arrangement.

A DUV illuminating system 500 which can be used in the machine in accordance with FIG. 1 is shown diagrammatically in FIG. 11 for the purpose of more detailed explanation. The illuminating system has a pupil-shaping unit 501 which receives the light coming from the laser 502 and reshapes the distribution of shape and beam angle in such a way that a desired two-dimensional intensity distribution of the radiation is present in a pupil-shaping surface 503. By suitable, computer-controlled setting of the optical components within the pupil-shaping unit 503, all current two-dimensional distributions of illuminating light can be set in the pupil-shaping surface 503, for example conventional illuminations of different diameter, annular settings or polar settings such as dipole or quadrupole settings. The pupil-shaping surface 503 is a pupil surface of the illuminating system. Arranged in the vicinity or in the pupil-shaping surface 503 is a two-dimensional lattice arrangement 504 of refractive lattice elements which has overall a rectangular emission characteristic, produces a major part of the photoconductance of the illuminating system and adapts the photoconductance via a downstream coupling optical system 505 to the desired field coverage in a downstream field plane 506 of the illuminating system. The pupil-shaping surface 503 is a Fourier-transformed plane relative to the downstream field plane 506, and so the spatial intensity distribution in the pupil-shaping surface is transformed into an angular distribution in the field surface 506.

Lying in the field plane 506 is the rectangular entrance surface of a rod-shaped light integrator 510 which is produced from synthetic silica glass or calcium fluoride, and mixes the light passing through by means of multiple internal reflection and homogenizes it in the process in such a way that there is a largely homogeneous intensity distribution in the exit surface of the rod integrator, the angular distribution of which corresponds to the angular distribution at the entrance surface of the rod integrator. Lying directly at the exit surface of the rod integrator is an intermediate field plane 520 in which there is arranged a radical masking system (REMA) 521 which serves as adjustable field stop. The downstream imaging objective 530 images the intermediate field plane 520 with the masking system 521 into the reticle plane (mask plane) 540, which is simultaneously the object plane of the downstream projection objective. The objective 530 includes a first lens group 531, a pupil intermediate plane 532 into which filters or stops can be introduced, a second and a third lens group 533, 534 and, lying therebetween, a flat deflecting mirror 550 which can be arranged in the region of largely collimated radiation in the vicinity of the pupil surface 532, and which permits the large illuminating device to be installed horizontally, and the reticle to be supported horizontally.

In the case of another embodiment, likewise shown in FIG. 11, the illuminating system is constructed without a separate light-mixing element, that is to say without an integrator rod or honeycomb condenser. In this case, the field plane 506 behind the coupling optical system 505 coincides with the plane of the reticle masking system 521, or is bridged by a suitable relay optics. In the case of this embodiment, a suitably designed lattice element of the type of the lattice element 504 can be modified such that there is already a sufficiently homogenized radiation intensity in the field plane 506.

The optical components of the illuminating system between the laser source 502 and the object plane 520 of the objective 530 can operate in a largely polarization-maintaining fashion, such that the radiation entering the objective 530 is substantially linearly polarized over the entire cross section (Sub-FIG. 11-1). Since such a polarization is unfavourable for illuminating the reticle, and can introduce imaging properties dependent on structural direction, the deflecting mirror 550 is designed as a reflective retardation arrangement having a retardation effect varying as a function of location, in order to convert linearly polarized input light into tangentially polarized output light (Sub-FIG. 11-2). The design of the deflecting mirror 550 can correspond to the design of the deflecting mirror 210 in accordance with FIG. 6, for which reason reference is made to the description there.

Should the optical components lying in the optical path upstream of the deflecting mirror have a polarization-varying effect overall, such that the radiation incident on the deflecting mirror has no polarization which is uniform over the cross section of the radiation beam, the deflecting mirror 550 can also be designed such that these variations in polarization are compensated over the cross section.

Figure 12:
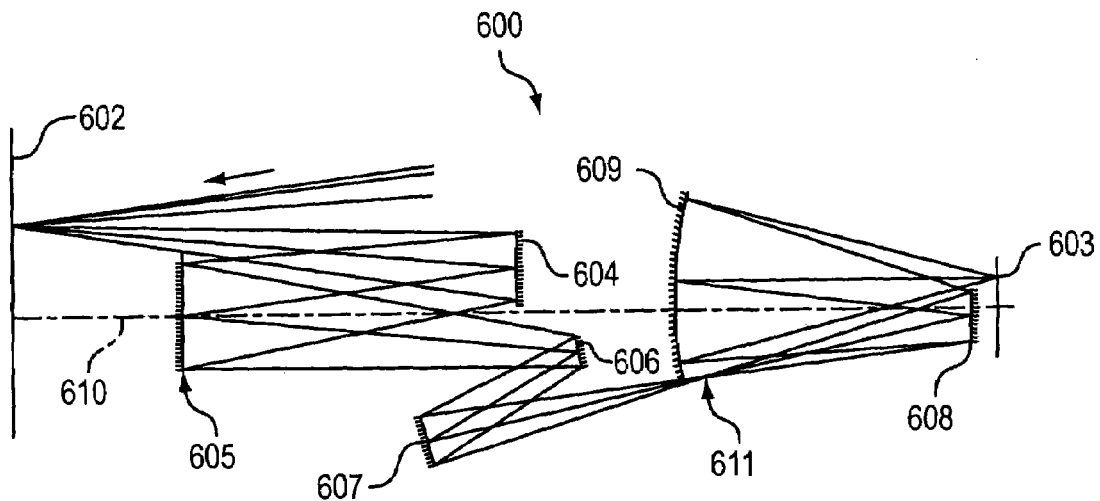
FIG. 12 is a diagrammatic illustration of an embodiment of an EUV projection objective having a reflective retardation arrangement.
Figure 13:
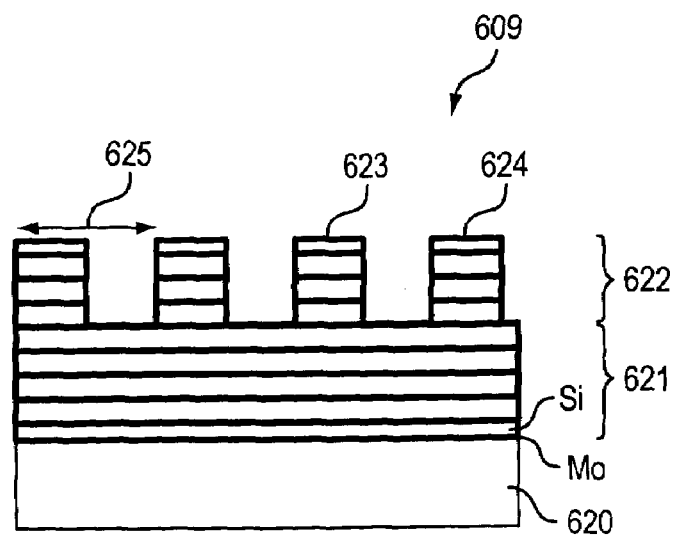
FIG. 13 is a diagrammatic illustration of a reflective retardation arrangement designed for extreme ultraviolet radiation (EUV).

It may be explained with the aid of FIGS. 12 and 13 that the invention can also be useful in projection exposure machines which work with radiation from the extreme ultraviolet region (EUV). FIG. 12 shows in this regard by way of example a projection system 600 whose design is described in the applicant's Patent Application US 2003/0099034 A1. The disclosure content of this patent application is incorporated in the content of this description by reference. The projection objective serves the purpose of projecting a pattern, arranged in its object plane 602, of a reflective reticle into an image plane 603, aligned parallel to the object plane, at a reduced scale, for example in the ratio 4:1. The operating wavelength is at approximately 13.4 nm. A total of six mirrors 604 to 609, provided with curved reflective surfaces and projected thereby, are arranged coaxially with one another between the object plane and the image plane in such a way that they define a common optical axis 610 which is perpendicular to the image plane and the object plane. The mirror substrates have the shape of rotationally symmetrical aspheres whose axes of symmetry coincide with the common mechanical axis 10. During the imaging a real intermediate image 511 is produced such that the projection objective has two pupil surfaces of which one lies in the vicinity of the mirror 605, and a second in the vicinity of the mirror 609. All the reflecting surfaces of the mirrors 604 to 609 are coated with multilayer reflective coatings which comprise a multiplicity of pairs of alternating layers made from silicon and molybdenum.

The concave mirror 609 is designed as a reflective retardation arrangement having a retardation effect varying locally over the useful cross section. It is divided into mutually bordering small retardation zones which cover the reflecting surface without gaps. The retardation zones can have the shape of a hexagon or circular segment, for example.

A diagrammatic section through the concave mirror 609 is shown in FIG. 13. Applied to a mirror substrate 620 made from silicon is a multilayer reflective coating system 621 which is constructed from alternating individual layers of molybdenum and silicon which cover the mirror substrate continuously. The reflective layer system 621 is coated with a relatively thin, structured multilayer mirror 622. The structured region 622 acting as diffractive structure comprises a multiplicity of webs 623, 624 which are arranged parallel to one another and are constructed in each case as an Mo—Si alternating layer package. The webs form a periodic lattice structure with a periodicity length 625 which is 13 nm in the case of the example and is therefore slightly below the operating wavelength of the ultraviolet radiation (13.5 nm). In the case of the example, the structures of the lattice 622 have 42 individual layers overall, while the reflecting layer 621 comprises 84 layers overall. The geometrical layer thicknesses are approximately 2.478 nm for the Mo individual layers, and 4.406 nm for the Si individual layers (period 13 nm).

Owing to the inhomogeneous material distribution in the region of the diffractive structure 622, the zero-order grating formed by the webs has a polarization-dependent phase transmission. Consequently, the phase of the reflected light is a function of polarization, such that the mirror acts like a retarder in each of its retardation zones. A simulation of the phase difference for an electric field polarized parallel (TE), and an electric field polarized perpendicular (TM) to the lattice structures in the case of perpendicular incidence of light exhibits a phase difference of $\lambda/100$ in the case of absolute phases of approximately $-0.024\lambda$ for the TE polarization and $-0.034\lambda$ for the TM polarization. The reflectivity for both polarization directions is, by contrast, virtually identical (73.7% for TE and 73.6% for TM polarization).

The local variation in the birefringent effect within the structured surface 622 can be implemented in various ways. It is, for example, possible for the diffractive structures to have a constant structural depth (height of the webs 623, 624, 625) within the surface, but a locally varying filling factor. The filling factor can be varied, for example, by varying the structural width (width of the webs 623, 624) while keeping the period 625 constant. It is also possible to provide a constant filling factor within the structured surface, but varying structural depth. The local birefringence effect can be adapted to the polarization distribution of the input radiation such that the radiation incident on the image plane 603 is polarized in a substantially uniform fashion.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

What is claimed is:

1. Projection exposure machine comprising:
   an illuminating system for receiving radiation from an EUV light source providing electromagnetic radiation from the extreme ultraviolet spectral region and for illuminating a pattern provided by a reflective mask;
   a projection objective for projecting an image of the pattern onto an image plane of the projection objective; and
   at least one reflective polarization influencing arrangement arranged optically between the EUV light source and the image plane influencing a polarization state of radiation incident on the polarization influencing arrangement in a manner predefined by the structure of the polarization influencing arrangement such that a polarization state of radiation downstream of the polarization influencing arrangement differs in a predefined manner from a polarization state of radiation upstream of the polarization influencing arrangement;

wherein the polarization influencing arrangement is a reflective retardation arrangement having a useful cross section onto which radiation impinges, where the useful cross section is subdivided into a multiplicity of retardation zones with different retardation effects, whereby an input radiation beam incident from an input side of the retardation arrangement is converted into an output radiation beam having, over the cross-section of the output radiation beam, a spatial distribution of polarization states which is influenced by the retardation arrangement and differs from the spatial distribution of polarization states of the input radiation; and wherein the retardation zones have a polygonal, circular sectional or annular sectional shape.

2. Projection exposure machine according to claim 1, wherein the polarization influencing arrangement is structured such that radiation incident on the image plane has a defined polarization state influenced by the polarization influencing arrangement.

3. Projection exposure machine according to claim 1, wherein the polarization influencing arrangement has a substrate and a reflective coating applied to the substrate, the reflective coating being effective for radiation from the extreme ultraviolet region and having a locally differing polarization-varying reflective effect.

4. Projection exposure machine according to claim 3, wherein the reflective coating forms retardation zones with differing retardation effects.

5. Projection exposure machine according to claim 3, wherein the reflective coating is designed as a multilayer reflective coating having single layers made of materials with alternating high refractive index and low refractive index lying one above another, wherein diffractive structural elements of structures running next to one another at a spacing are formed in the reflective coating.

6. Projection exposure machine according to claim 5, wherein the diffractive structures are designed to form retardation zones with differing retardation effects varying locally across the reflective coating.

7. Projection exposure machine according to claim 3, wherein the multilayer reflective coating comprises a multiplicity of pairs of alternating layers made from silicon and molybdenum.

8. Projection exposure machine according to claim 1, wherein the polarization influencing element is designed as a concave mirror.

9. Projection exposure machine according to claim 1, wherein the polarization influencing arrangement is arranged in the projection objective such that the polarization state of radiation reflected from the reflective mask is influenced by the polarization influencing arrangement prior to impinging on the image surface of the projection objective.

10. Projection exposure machine according to claim 1, wherein the projection objective has an even number of curved reflective surfaces arranged coaxially with one another between the object plane and the image plane, the reflective surfaces defining a common optical axis of the projection objective, where all the reflective surfaces are coated with a multilayer reflective coating and where at least one reflective surface is designed as a polarization influencing arrangement.

11. Projection exposure machine according to claim 10, wherein the polarization influencing element is designed as a concave mirror.

12. Projection exposure machine according to claim 1, wherein there is a constant effect on polarization across each of the retardation zones.

13. Projection exposure machine according to claim 1 wherein each zone has a polygonal shape.

14. Projection exposure machine according to claim 1 wherein each retardation zone has a square shape.

15. Projection exposure machine according to claim 1 wherein each retardation zone has a hexagonal shape.

16. Projection exposure machine according to claim 1 wherein each retardation zone has an annular shape.

17. Projection exposure machine according to claim 1 wherein each retardation zone has a triangular shape.

18. Projection exposure machine according to claim 1, wherein the mean cross sectional area of the retardation zones is between about 1% and about 10% of the useful cross sectional area.

19. Projection exposure machine comprising:

an illuminating system for receiving radiation from an EUV light source providing electromagnetic radiation from the extreme ultraviolet spectral region and for illuminating a pattern provided by a reflective mask;

a projection objective for projecting an image of the pattern onto an image plane of the projection objective; and at least one reflective polarization influencing arrangement arranged optically between the EUV light source and the image plane influencing a polarization state of radiation incident on the polarization influencing arrangement in a manner predefined by the structure of the polarization influencing arrangement such that a polarization state of radiation downstream of the polarization influencing arrangement differs in a predefined manner from a polarization state of radiation upstream of the polarization influencing arrangement;

wherein the polarization influencing arrangement is structured such that radiation incident on the image plane has a defined polarization state influenced by the polarization influencing arrangement; and wherein the polarization influencing arrangement is designed such that the radiation incident on the image plane is polarized in a substantially uniform fashion in the image plane.

20. Projection exposure machine according to claim 19, wherein the polarization influencing arrangement is a reflective retardation arrangement having a useful cross section onto which radiation impinges, where the useful cross section is subdivided into a multiplicity of retardation zones with different retardation effects, whereby an input radiation beam incident from an input side of the retardation arrangement is converted into an output radiation beam having, over the cross-section of the output radiation beam, a spatial distribution of polarization states which is influenced by the retardation arrangement and differs from the spatial distribution of polarization states of the input radiation.

21. Projection exposure machine according to claim 19, wherein the polarization influencing arrangement has a substrate and a reflective coating applied to the substrate, the reflective coating being effective for radiation from the extreme ultraviolet region and having a locally differing polarization-varying reflective effect.

22. Projection exposure machine according to claim 19, wherein the reflective coating is designed as a multilayer reflective coating having single layers made of materials with alternating high refractive index and low refractive index lying one above another, wherein diffractive structural elements of structures running next to one another are formed in the reflective coating, where the diffractive structural elements have an alignment, a periodicity spacing and a structural depth and wherein at least one of the alignment, the periodicity spacing and the structural depth varies locally to form retardation zones of different retardation effects.

23. Projection exposure machine according to claim 19, wherein the polarization influencing arrangement is arranged in the projection objective such that the polarization state of radiation reflected from the reflective mask is influenced by the polarization influencing arrangement prior to impinging on the image surface of the projection objective.

24. Projection exposure machine according to claim 19, wherein the polarization influencing element is designed as a concave mirror.

25. Projection exposure machine according to claim 19, wherein the projection objective has an even number of curved reflective surfaces arranged coaxially with one another between the object plane and the image plane, the reflective surfaces defining a common optical axis of the projection objective, where all the reflective surfaces are coated with a multilayer reflective coating and where at least one reflective surface is designed as a polarization influencing arrangement.

26. Projection exposure machine comprising:
an illuminating system for receiving radiation from an EUV light source providing electromagnetic radiation from the extreme ultraviolet spectral region and for illuminating a pattern provided by a reflective mask;
a projection objective for projecting an image of the pattern onto an image plane of the projection objective; and
at least one reflective polarization influencing arrangement arranged optically between the EUV light source and the image plane influencing a polarization state of radiation incident on the polarization influencing arrangement in a manner predefined by the structure of the polarization influencing arrangement such that a polarization state of radiation downstream of the polarization influencing arrangement differs in a predefined manner from a polarization state of radiation upstream of the polarization influencing arrangement;
wherein the polarization influencing arrangement has a substrate and a reflective coating applied to the substrate, the reflective coating being effective for radiation from the extreme ultraviolet region and having a locally differing polarization-varying reflective effect;
wherein the reflective coating is designed as a multilayer reflective coating having single layers made of materials with alternating high refractive index and low refractive index lying one above another, wherein diffractive structural elements of structures running next to one another at a spacing are formed in the reflective coating; and
wherein the diffractive structure comprises a multiplicity of webs arranged parallel to one another forming a periodic lattice structure with a periodicity length smaller than the wavelength of the EUV radiation, where different periodic lattice structures are arranged next to each other to provide a local variation of birefringent effect within the structured surface of the multilayer coating.

27. Projection exposure machine according to claim 26, wherein the polarization influencing arrangement is designed such that the radiation incident on the image plane is polarized in a substantially uniform fashion in the image plane.

28. Projection exposure machine according to claim 26, wherein the diffractive structures are designed to form retardation zones with differing retardation effects varying locally across the reflective coating.

29. Projection exposure machine according to claim 26, wherein the polarization influencing element is designed as a concave mirror.

30. Projection exposure machine according to claim 26, wherein the polarization influencing arrangement is arranged in the projection objective such that the polarization state of radiation reflected from the reflective mask is influenced by the polarization influencing arrangement prior to impinging on the image surface of the projection objective.

31. Projection exposure machine according to claim 26, wherein the projection objective has an even number of curved reflective surfaces arranged coaxially with one another between the object plane and the image plane, the reflective surfaces defining a common optical axis of the projection objective, where all the reflective surfaces are coated with a multilayer reflective coating and where at least one reflective surface is designed as a polarization influencing arrangement.

32. Projection exposure machine comprising:
an illuminating system for receiving radiation from an EUV light source providing electromagnetic radiation from the extreme ultraviolet spectral region and for illuminating a pattern provided by a reflective mask;
a projection objective for projecting an image of the pattern onto an image plane of the projection objective; and
at least one reflective polarization influencing arrangement arranged optically between the EUV light source and the image plane influencing a polarization state of radiation incident on the polarization influencing arrangement in a manner predefined by the structure of the polarization influencing arrangement such that a polarization state of radiation downstream of the polarization influencing arrangement differs in a predefined manner from a polarization state of radiation upstream of the polarization influencing arrangement;
wherein the polarization influencing arrangement has a substrate and a reflective coating applied to the substrate, the reflective coating being effective for radiation from the extreme ultraviolet region and having a locally differing polarization-varying reflective effect; and
wherein the reflective coating is designed as a multilayer reflective coating having single layers made of materials with alternating high refractive index and low refractive index lying one above another, wherein diffractive structural elements of structures running next to one another are formed in the reflective coating, where the diffractive structural elements have an alignment, a periodicity spacing and a structural depth and wherein at least one of the alignment, the periodicity spacing and the structural depth varies locally to form retardation zones of different retardation effects.

33. A projection apparatus, comprising:
a projection objective consisting essentially of a plurality of mirror surfaces projecting radiation from the extreme ultraviolet spectral region, said mirror surfaces projecting a pattern, provided by the radiation reflected by a mask and arranged in an object plane of said projection objective, into an image plane of said projection objective;

wherein at least one of said mirror surfaces comprises a reflective polarization influencing arrangement having a useful cross section reflecting the radiation and subdivided into a multiplicity of retardation zones providing mutually different retardation of the radiation, wherein a spatial distribution of polarization states of the radiation upstream of the arrangement differs from the spatial distribution of the polarization states of the radiation downstream of the arrangement; and wherein the retardation zones have a polygonal, circular sectional or annular sectional shape.

34. The projection apparatus according to claim 33, wherein the arrangement comprises a substrate and a multilayer reflective coating, and wherein the reflective coating comprises a structured region forming diffractive structural elements at a mutual spacing that is less than the wavelength of the radiation.

35. Projection exposure machine comprising:

an illuminating system for receiving radiation from an EUV light source providing electromagnetic radiation from the extreme ultraviolet spectral region and for illuminating a pattern provided by a reflective mask;

a projection objective for projecting an image of the pattern onto an image plane of the projection objective; and at least one reflective polarization influencing arrangement arranged optically between the EUV light source and the image plane influencing a polarization state of radiation incident on the polarization influencing arrangement in a manner predefined by the structure of the polarization influencing arrangement such that a polarization state of radiation downstream of the polarization influencing arrangement differs in a predefined manner from a polarization state of radiation upstream of the polarization influencing arrangement;

wherein the polarization influencing arrangement is a reflective retardation arrangement having a useful cross section onto which radiation impinges, where the useful cross section is subdivided into a multiplicity of retardation zones with different retardation effects, whereby an input radiation beam incident from an input side of the retardation arrangement is converted into an output radiation beam having, over the cross-section of the output radiation beam, a spatial distribution of polarization states which is influenced by the retardation arrangement and differs from the spatial distribution of polarization states of the input radiation; and wherein there is a constant effect on polarization across each of the retardation zones.

36. Projection exposure machine according to claim 35, wherein the retardation zones have a polygonal, circular, circular sectional or annular sectional shape.

* * * * *